(12) United States Patent
El-Mansouri et al.

(10) Patent No.: US 8,928,357 B1
(45) Date of Patent: Jan. 6, 2015

(54) SENSE AMPLIFIER WITH CROSS-COUPLED TRANSISTOR PAIR

(71) Applicant: Nanya Technology Corporation, Taoyuan (TW)

(72) Inventors: Adam Saleh El-Mansouri, Boise, ID (US); Adrian Jay Drexler, Boise, ID (US); Hofstetter Martin Ryan, Boise, ID (US)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 14/051,458

(22) Filed: Oct. 11, 2013

(51) Int. Cl.
*H03F 3/45* (2006.01)
*G11C 7/06* (2006.01)

(52) U.S. Cl.
CPC ............ *H03F 3/45179* (2013.01); *G11C 7/065* (2013.01); *H03F 2003/45008* (2013.01); *H03F 2200/471* (2013.01); *H03F 2203/45294* (2013.01)
USPC .................................. 327/55; 327/52; 327/57

(58) Field of Classification Search
USPC ................... 327/52, 54, 55, 57; 365/205, 207
See application file for complete search history.

(56) References Cited

U.S. PATENT DOCUMENTS

| 7,230,868 | B2 * | 6/2007 | Madan et al. | 365/207 |
| 7,477,076 | B2 * | 1/2009 | Miyatake | 327/55 |
| 2002/0021147 | A1 * | 2/2002 | Lim et al. | 327/57 |
| 2011/0292709 | A1 * | 12/2011 | Takayama et al. | 365/208 |

* cited by examiner

*Primary Examiner* — Long Nguyen
(74) *Attorney, Agent, or Firm* — Jianq Chyun IP Office

(57) ABSTRACT

A sense amplifier is provided. The sense amplifier comprises a first and second cross-coupled transistor pairs, a first and second current sources, a first digital input transistor, and a second digital input transistor. The first and second ends of the first cross-coupled transistor pair are coupled to an operating voltage, the first and second back gate ends of the first cross-coupled transistor pair are coupled to a first and second output ends respectively. The first and second back gate ends of the first cross-coupled transistor pair are coupled to a first and second output ends respectively, and the first and second ends of the first cross-coupled transistor pair are coupled to a first digital input end and second digital input end respectively.

15 Claims, 33 Drawing Sheets

SENSE AMPLIFIER WITH CROSS-COUPLED TRANSISTOR PAIR

BACKGROUND OF THE INVENTION

1. Field of Invention

The present invention generally relates to a sense amplifier, and more particularly to a sense amplifier with cross-coupled transistor pairs.

2. Description of Prior Art

Along with the rapid development of science and technology at the present, a memory is widely used in an electronic device. In the memory, a sense amplifier is used to sense a data transporting by a differential signal for writing to or reading from the memory.

Currently used sense amplifier technology uses a plurality of devices that require a complete flip of the digital signals, and a large amount of current is generated in the sense amplifier. Existing art also suffers from adjacent amplifier and digital disturbance causing data signal sensing degradation. That is, the conventional sense amplifier generates a large amount of noise, caused by the tight spatial proximity and large amount of voltage swing required on the digital signals. The present art provides enhanced sensing speed and accuracy at low power.

SUMMARY OF THE INVENTION

The present invention provides a plurality of sense amplifiers for reducing power consumption, noise disturbance between adjacent digital and sensing amplifiers, and increased sensing speed with low power.

The present invention provides a sense amplifier. The sense amplifier comprises a first and second cross-coupled transistor pairs, a first and second current sources, a first digital input transistor, and a second digital input transistor. The first cross-coupled transistor pair, having a first end, a second end, a first back gate end and a second back gate end. The first and second ends of the first cross-coupled transistor pair are coupled to an operation voltage, the first and second back gate ends of the first cross-coupled transistor pair are coupled to a first and second output ends respectively. The second cross-coupled transistor pair, having a first end, a second end, a first back gate end and a second back gate end. The first and second back gate ends of the second cross-coupled transistor pair are coupled to a first and second output ends respectively, and the first and second ends of the second cross-coupled transistor pair are coupled to a first digital input end and second digital input end respectively. The first current source is coupled between the first digital input end and a ground voltage, the second current source is coupled between the second digital input end and the ground voltage. The first digital input transistor, having a first end, a second end and a control end. The first end of the first digital input transistor receives a first digital input signal, the second end of the first digital input transistor is coupled to the first digital input end, and the control end of the first digital input transistor is coupled to the second back gate end of the second cross-coupled transistor pair. The second digital input transistor, having a first end, a second end and a control end, the first end of the first digital input transistor receives a second digital input signal, the second end of the second digital input transistor is coupled to the second digital input end, and the control end of the second digital input transistor is coupled to the first back gate end of the second cross-coupled transistor pair.

The present invention provides another sense amplifier. The sense amplifier comprises a first and second cross-coupled transistor pairs, a first and second current sources, and a first and second digital input transistor. The first cross-coupled transistor pair having a first end, a second end, a first back gate end and a second back gate end, the first and second ends of the first cross-coupled transistor pair are coupled to an operation voltage, the first and second back gate ends of the first cross-coupled transistor pair are coupled to a first and second output ends respectively. The second cross-coupled transistor pair, having a first end, a second end, a first back gate end and a second back gate end, the first and second back gate ends of the second cross-coupled transistor pair are coupled to a first and second output ends respectively, and the first and second ends of the second cross-coupled transistor pair are coupled to a first digital input end and second digital input end respectively. The first and second current sources are coupled between the first digital input end and a ground voltage, the second current source is coupled between the second digital input end and the ground voltage. The first digital input transistor, having a first end, a second end and a control end, the first end of the first digital input transistor receiving a first digital input signal, the second end of the first digital input transistor is coupled to the first digital input end, and the control end of the first digital input transistor receives a read signal. The second digital input transistor, having a first end, a second end and a control end, the first end of the second digital input transistor receives a second digital input signal, the second end of the second digital input transistor is coupled to the second digital input end, and the control end of the second digital input transistor receives the read signal.

Accordingly, the presented application provides a plurality of sense amplifiers with a first and second cross-coupled transistor pairs. In this structure, the power consumption of the sense amplifier is reduced, and the noise between data lines is reduced, too. Moreover, the data sensing speed of the sense amplifier is improved, and the sensitivity of the device mismatch can be reduced, too.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
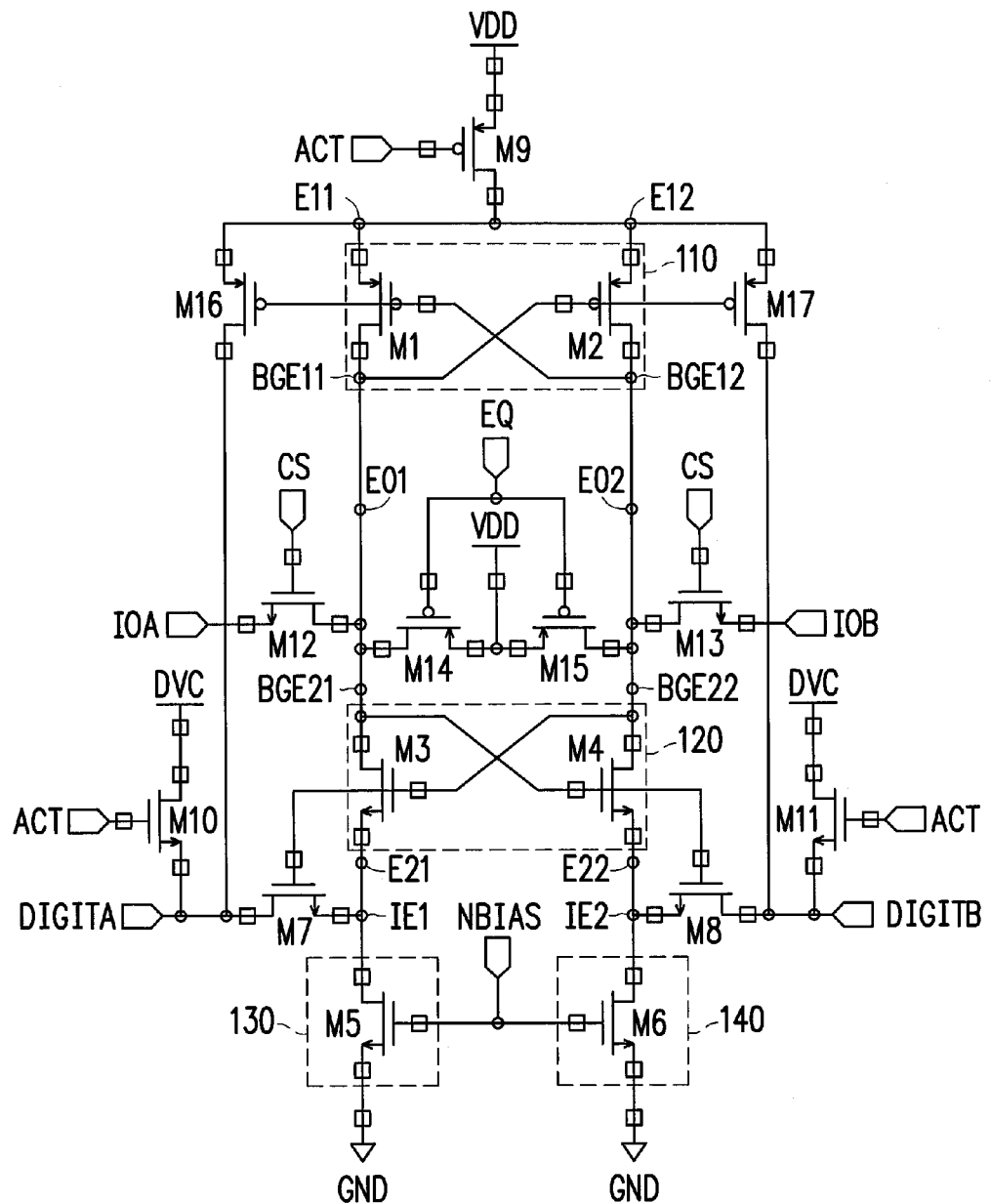
FIG. 1A is a circuit diagram of a sense amplifier 100 according to an embodiment of the present invention.

Reference will now be made in detail to the present preferred embodiment of the invention, examples of which are illustrated in the accompanying drawings. Wherever possible, the same reference numbers are used in the drawings and the description to refer to the same or like parts.

Referring to FIG. 1A, FIG. 1A is a circuit diagram of a sense amplifier 100 according to an embodiment of the present invention. The sense amplifier 100 includes a first cross-coupled transistor pair 110, a second cross-coupled transistor pair 120, a first current source 130, a second current source 140 and digital input transistors M7 and M8. The first cross-coupled transistor pair 110 has a first end E11, a second end E12, a first back gate end BGE11 and a second back gate end BGE12. The first and second ends E11 and E12 of the first cross-coupled transistor pair 110 are coupled to an operation voltage VDD through a transistor M9. The first and second back gate ends BGE11 and BGE12 of the first cross-coupled transistor pair 110 are coupled to a first and second output ends EO1 and EO2 respectively. The second cross-coupled transistor pair 120 has a first end E21, a second end E22, a first back gate end BGE21 and a second back gate end BGE22. The first and second back gate ends BGE21 and BGE22 of the second cross-coupled transistor pair 120 are coupled to a first and second output ends EO1 and EO2 respectively. The first and second ends E21 and E22 of the second cross-coupled transistor pair 120 are coupled to a first digital input end IE1 and second digital input end IE2 respectively.

The first current source 130 is coupled between the first digital input end IE1 and a ground voltage GND, and the second current source 140 is coupled between the second digital input end IE2 and the ground voltage GND. In this embodiment, the first current source 130 is formed by a transistor M5, and the current source 140 is formed by a transistor M6. A first end of the transistor M5 is coupled to the first digital input end IE1, and a second end of the transistor M5 is coupled to the ground voltage GND. A first end of the transistor M6 is coupled to the second digital input end IE2, and a second end of the transistor M6 is coupled to the ground voltage GND. Control ends of transistors M5 and M6 are coupled to a bias voltage NBIAS, and currents generated by the first and second current source 130 and 140 are controlled by the bias voltage NBIAS.

The first cross-coupled transistor pair 110 includes transistors M1 and M2. A first end of the transistor M1 is coupled to the first end E11 of the first cross-coupled transistor pair 110, a second end of the transistors M1 is coupled to the first back gate end BGE11 of the first cross-coupled transistor pair 110, and a control end of the transistors M1 is coupled to the second back gate end BGE12 of the first cross-coupled transistor pair 110. A first end of the second transistor M2 is coupled to the second end E12 of the first cross-coupled transistor pair 110, a second end of the transistor M2 is coupled to the second back gate end BGE12 of the first cross-coupled transistor pair 110, and a control end of the transistors M2 is coupled to the second back gate end BGE11 of the first cross-coupled transistor pair 110.

The second cross-coupled transistor pair 120 includes transistors M3 and M4. A first end of the transistor M3 is coupled to the first end E21 of the second cross-coupled transistor pair 120, a second end of the transistor M3 is coupled to the first back gate end BGE21 of the second cross-coupled transistor pair 120, and a control end of the transistors M3 is coupled to the second back gate end BGE22 of the second cross-coupled transistor pair 120. A first end of the second transistor M4 is coupled to the second end E22 of the second cross-coupled transistor pair 120, a second end of the transistors M4 is coupled to the second back gate end BGE22 of the of the second cross-coupled transistor pair 120, and a control end of the transistors M4 is coupled to the first back gate end BGE21 of the second cross-coupled transistor pair 120.

A first end of the digital input transistor M7 receives a first digital input signal DIGITA, a second end of the digital input transistor M7 is coupled to the first digital input end IE1, and a control end of the digital input transistor M7 is coupled to the second back gate end BGE22 of the second cross-coupled transistor pair 120. A first end of the digital input transistor M8 receives a second digital input signal DIGITB, a second end of the digital input transistor M8 is coupled to the first digital input end IE2, and a control end of the digital input transistor M8 is coupled to the second back gate end BGE21 of the second cross-coupled transistor pair 120.

The sense amplifier 100 further includes three active switches which are formed by transistors M9-M11 respectively. The active switch formed by the transistor M9 is coupled on a path for the first cross-coupled transistor pair 110 receiving the operating operation voltage VDD, and the first active switch is turned on or turned off according to an active signal ACT. In FIG. 1A, a first end of the transistor M9 is coupled to the operating operation voltage VDD, a second end of the transistor M9 is coupled to the first and second ends E11 and E12 of the first cross-coupled transistor pair 110, and the control end of the transistor M9 is used to receive the active signal ACT. In FIG. 1A, a first end of the transistor M10 is coupled to the reference voltage DVC, a second end of the transistor M10 is coupled to the first end of the digital input transistor M7, and the control end of the transistor M10 is used to receive the active signal ACT. A first end of the transistor M11 is coupled to the reference voltage DVC, a second end of the transistor M10 is coupled to the first end of the digital input transistor M8, and the control end of the transistor M11 is used to receive the active signal ACT.

The sense amplifier 100 further includes a first and second input-output (IO) switches, and the first and second IO switches are composed of transistors M12 and M13 respectively. A first end of the first IO switch is coupled to a first IO signal IOA, and a second end of the first IO switch is coupled to the first output end EO1. The first end of the second IO switch is coupled to a second IO signal IOB, and a second end of the second IO switch is coupled to the second output end EO2. The first and second IO switches are controlled by a control signal CS. That is, a first and second ends of the transistor M12 are coupled between the first IO signal IOA and the first output end EO1, a first and second ends of the transistor M13 are coupled between the second IO signal IOB and the second output end EO2, and the control ends of the transistors M12 and M13 receive the control signal CS.

The sense amplifier 100 further includes equalize switches which are composed of transistors M14 and M15, respectively. The equalize switch composed of transistor M14 is coupled between the operating voltage VDD and the first output end EO1, the second equalize switch composed of transistor M15 is coupled between the operating voltage VDD and the second output end EO2. Wherein, the equalize switches are controlled by an equalize signal EQ for turning on or turning off. Beside, a first end of the transistor M16 is coupled to the first end E11 of the first cross-coupled transistor pair 110, and a second end of the transistors M16 is coupled to the first digital input signal DIGITA. A first end of the transistor M17 is coupled to the first end E12 of the first cross-coupled transistor pair 110, and a second end of the transistors M17 is coupled to the second digital input signal DIGITB. The control ends of the transistors M16 and M17 are respectively coupled to the first and second back gate ends BGE11 and BGE12.

Please notice here, the transistor M1, M2, M9, M14, M15, M16, and M17 are P-type transistors, and the transistors M3, M4, M5, M6, M7, M8, M10, M11, M12 and M13 are N-type transistors.

Figure 1B:
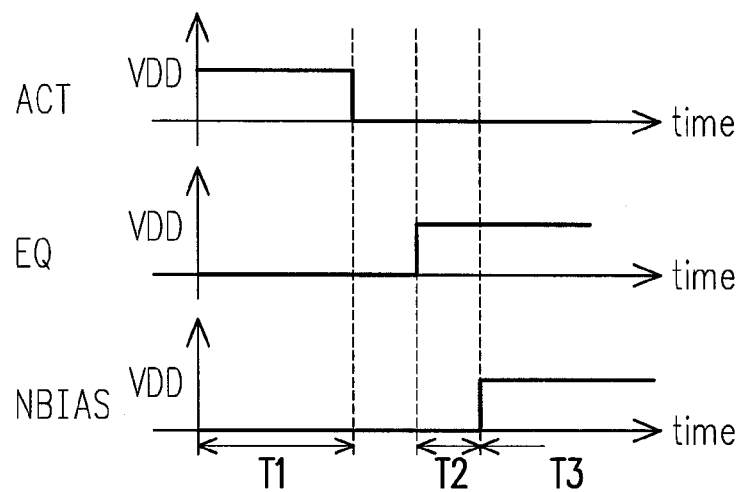
FIG. 1B-1D are waveforms of the sense amplifier 100 according to an embodiment of the present invention.
Figure 1C:
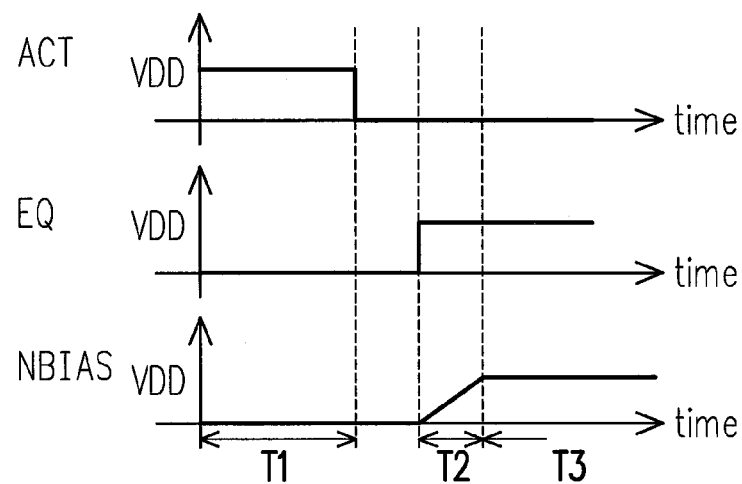
Figure 1D:
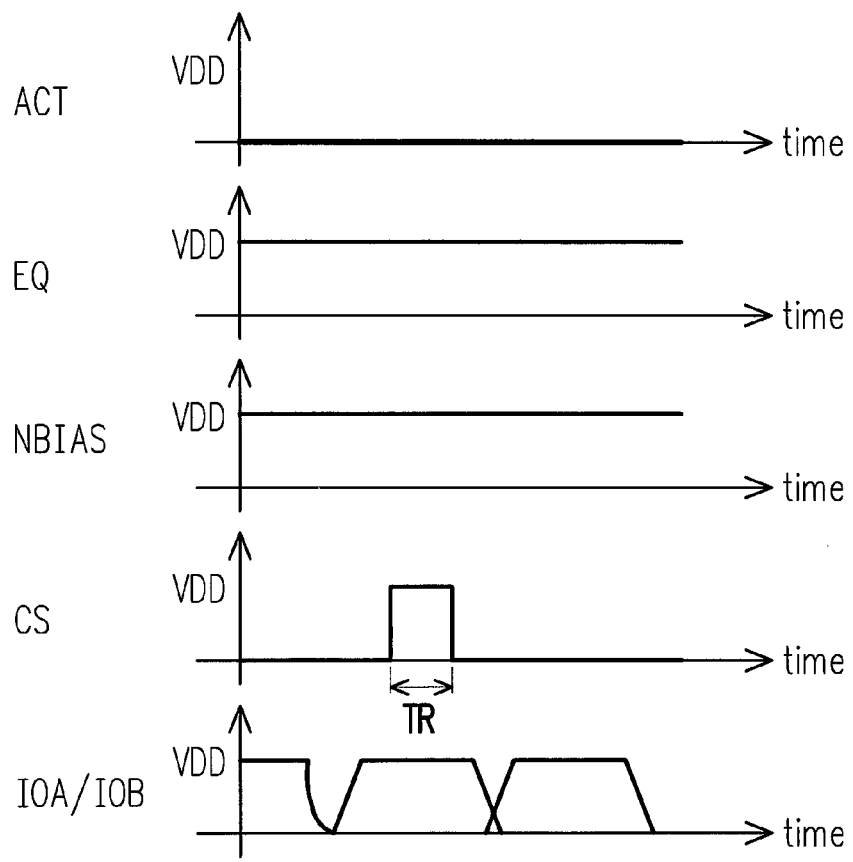

Please refer to FIG. 1B-1D, wherein, FIG. 1B-1D are a waveforms of the sense amplifier 100 according to an embodiment of the present invention. In FIG. 1B, when a read command is processed in the sense amplifier 100, during the time period T1, the active signal ACT is pulled up to equal to logic high voltage (equal to the operating voltage VDD), and the transistor M9 is turned off, M10 and M11 are turned on accordingly. The first and second digital input signals DIGITA and DIGITB are pulled up to equal to the reference voltage DVC, wherein, a voltage level of the reference voltage DVC may be smaller than a voltage level of the operating voltage VDD. Besides, the transistors M3 and M4 of the second cross-coupled transistor pair 120 are held off by biasing the reference voltage DVC which is above the threshold voltage of transistors M3 and M4.

The active signal ACT is pulled down to equal to logic low voltage when the time period T1 is finished. Moreover, during the time period T2, the equalize signal EQ is pulled up to be equal to logic high voltage (equal to the operating voltage VDD), and the transistors M14 and M15 are turned off accordingly. Please notice here, during the time period T2, the equalize signal EQ is pulled up to equal to the operating voltage VDD and the first and second output ends EO1 and EO2 are released from the equalized voltage VDD.

During the time period T3, the bias voltage NBIAS is pulled up to be equal to the operating VDD after the first and second output ends EO1 and EO2 are released from equalization. Correspondingly, the first and second current sources 130 and 140 generate bias currents for flowing through the transistors M3 and M4 respectively.

When the first and second digital input signals DIGITA and DIGITB are sent from a corresponding memory cell, the voltage levels of the first and second digital input signals DIGITA and DIGITB are reduced. At this time, one of the transistors M3 and M4 is turned on (the other one is turned off), and one of the transistors M1 and M2 is turned on (the other one is turned off), and voltage levels on the first and second output ends IE1 and IE2, swing to a rail.

In FIG. 1C, when a read command is processed in the sense amplifier 100, the bias voltage NBIAS may be pulled up with a ramp wave in the time period T3. Such as that, the currents generated by the first and second current sources 130 and 140 increase smoothly, and an electromagnetic interference (EMI) cause by the sense amplifier 100 can be reduced.

In FIG. 1D, when a write command is processed in the sense amplifier 100, the active signal ACT is taken to GND, the equalize signal EQ and the bias signal NBIAS are kept equal to the operating voltage VDD. When the control signal CS is pulled high (equal to the operating voltage) during a time period TR, the data on the first IO signal IOA or the second IO signal IOB can be written to the sense amplifier 100.

Figure 2A:
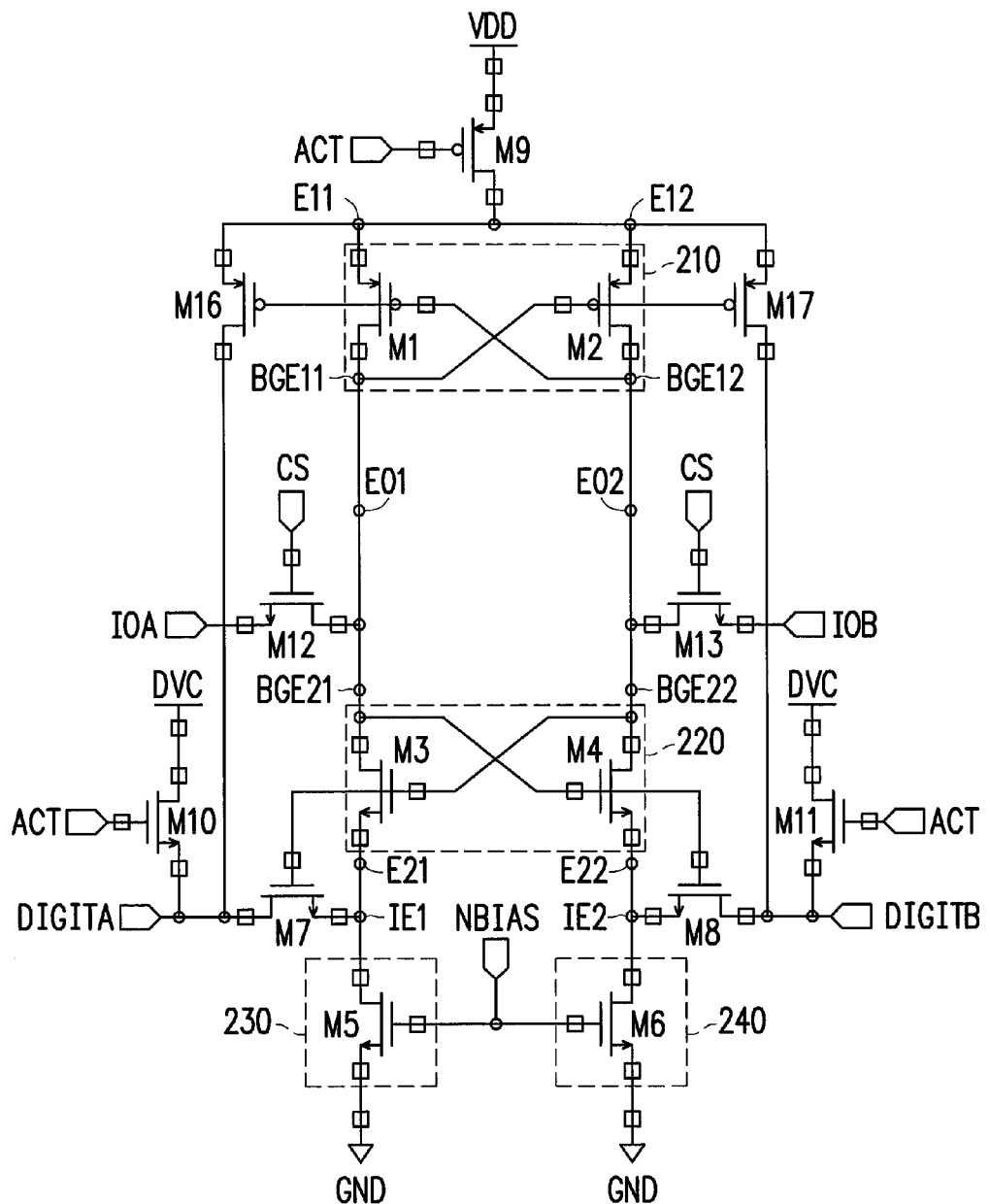
FIG. 2A is a circuit diagram of a sense amplifier 200 according to an embodiment of the present invention.

Referring to FIG. 2A, FIG. 2A is a circuit diagram of a sense amplifier 200 according to an embodiment of the present invention. The sense amplifier 200 includes a first cross-coupled transistor pair 210, a second cross-coupled transistor pair 220, a first current source 230, a second current source 240, digital input transistors M7 and M8 and first and second IO transistors M12 and M13. The sense amplifier 200 further includes a first to third active switches respectively composed of transistors M9-M11. Different from the sense amplifier 100 in FIG. 1A, there are no equalize transistors in sense amplifier 200. The first and second output ends may be equalized by allowing the ends of the first and second IO transistors M12 and M13, and the ends which are using to respectively receive the first and second IO signals IOA and IOB when the control signal CS is enabled.

Figure 2B:
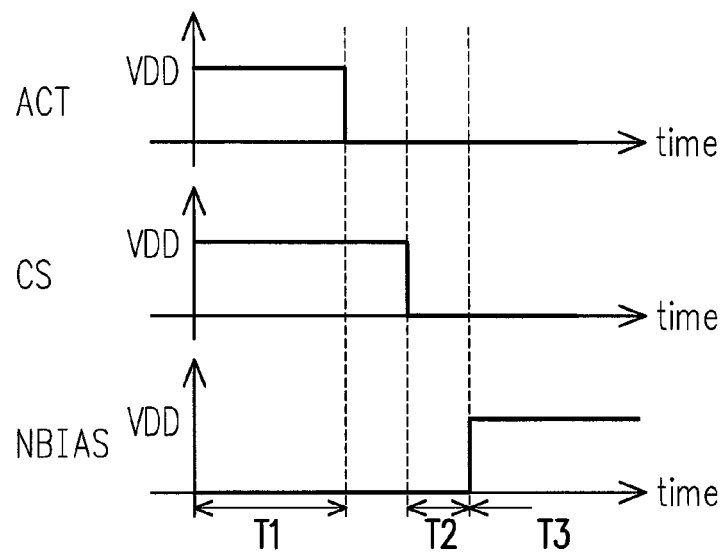
FIG. 2B-2C are waveforms of the sense amplifier 200 according to an embodiment of the present invention.
Figure 2C:
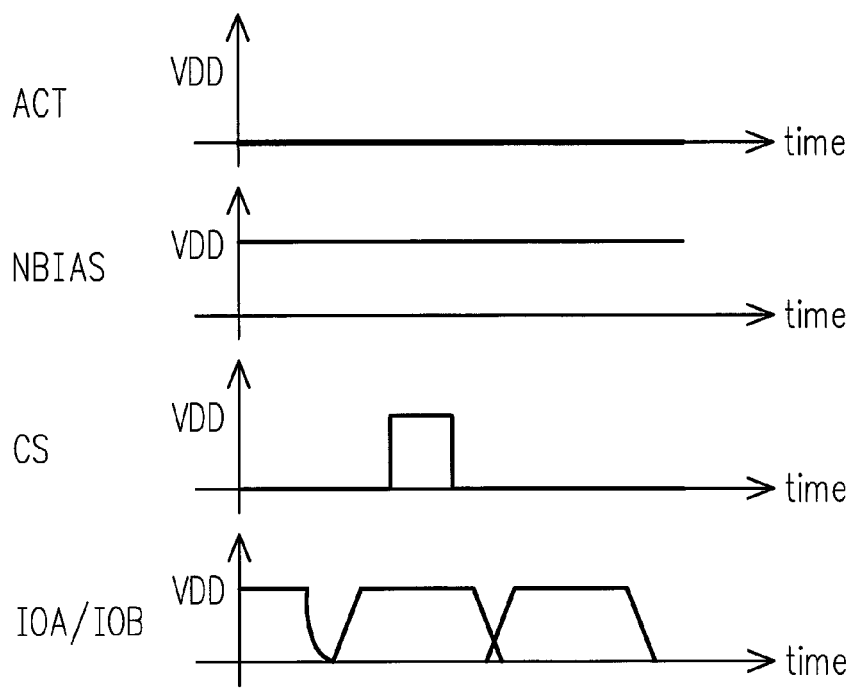

About the operation of the sense amplifier 200, please refer to FIG. 2B-2C. FIG. 2B-2C are a waveforms of the sense amplifier 200 according to an embodiment of the present invention. Different from the sense amplifier 100, in FIG. 2B, the first and second output ends of the sense amplifier 200 are equalized by pulling the control signal CS equal to the operating signal VDD during the time period T1. When a write command is processed, refer to FIG. 2C, the data on the first or second IO signals is written to the sense amplifier 200 when the control signal CS is pulled up.

Figure 3A:
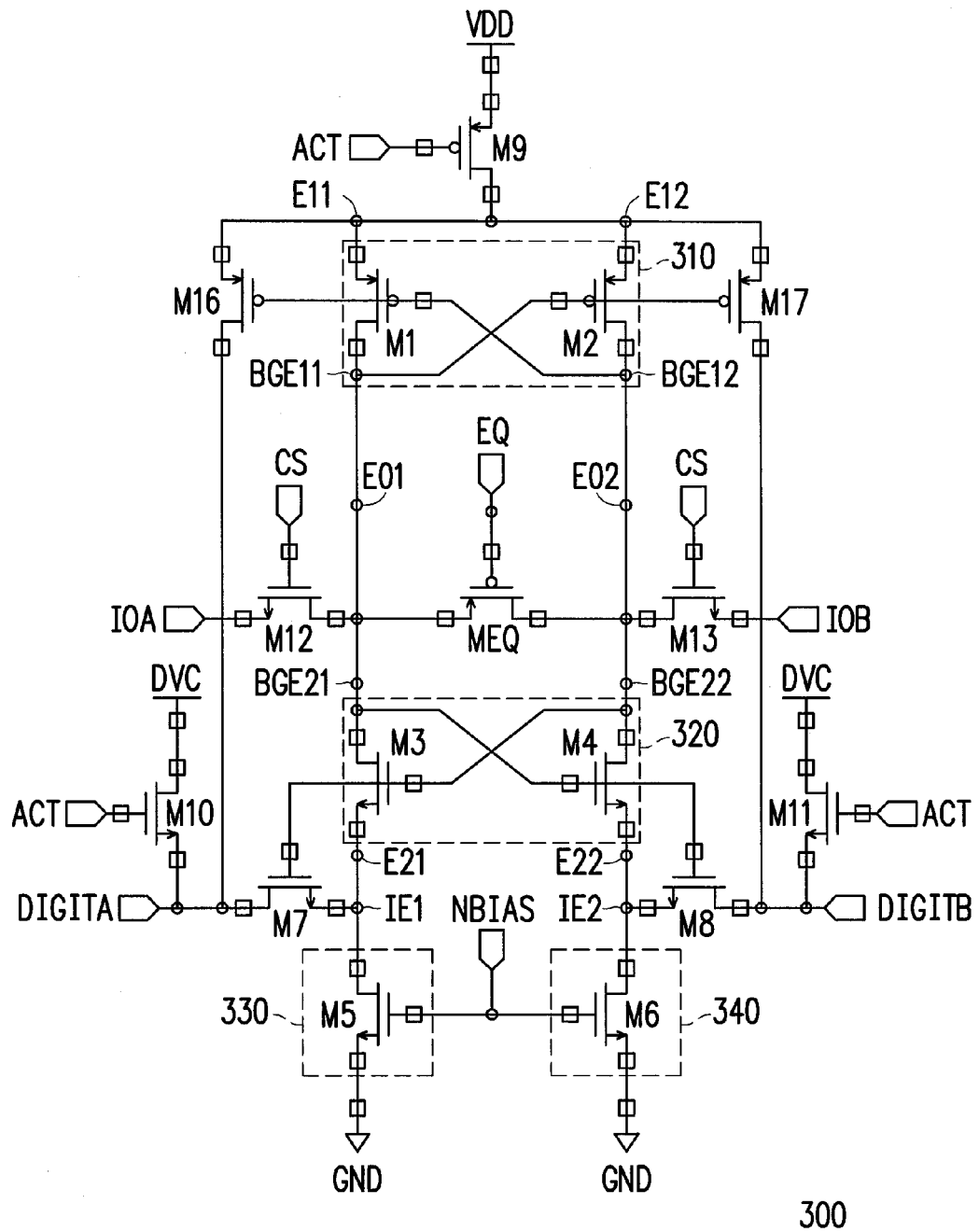
FIG. 3A is a circuit diagram of a sense amplifier 300 according to an embodiment of the present invention.

Referring to FIG. 3A, FIG. 3A is a circuit diagram of a sense amplifier 300 according to an embodiment of the present invention. The sense amplifier 300 includes a first cross-coupled transistor pair 310, a second cross-coupled transistor pair 320, a first current source 330, a second current source 340, digital input transistors M7 and M8 and first and second IO transistors M12 and M13. The sense amplifier 300 further includes a first to third active switches respectively composed of transistors M9-M11. Different from the sense amplifier 100 in FIG. 1A, the equalize circuit of the sense amplifier 300 is composed of a single equalize switch. The equalize switch of the sense amplifier 300 is composed of a transistor MEQ. A first and second ends of transistor MEQ are coupled the first and second output ends EO1 and EO2, and a control end of transistor MEQ receives the equalize signal EQ. In this embodiment, when the equalize signal EQ is pulled to logic low level, the transistor MEQ is turned on, and the voltages on the first and second output ends EO1 and EO2 are equalized.

Figure 3B:
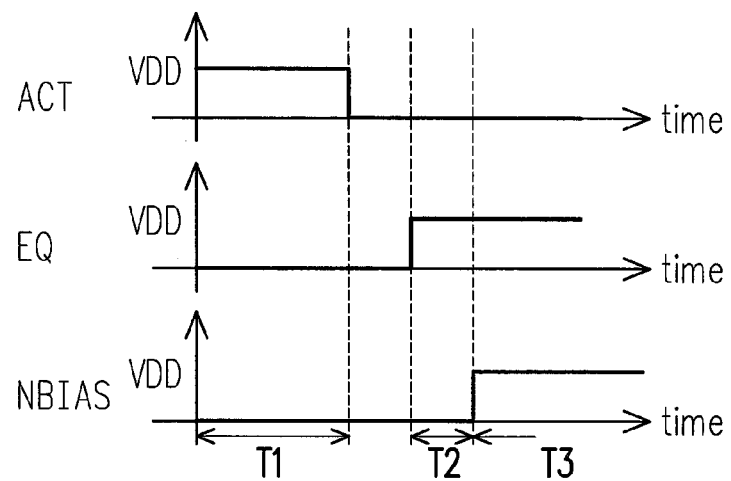
FIG. 3B-3D are waveforms of the sense amplifier 300 according to an embodiment of the present invention.
Figure 3C:
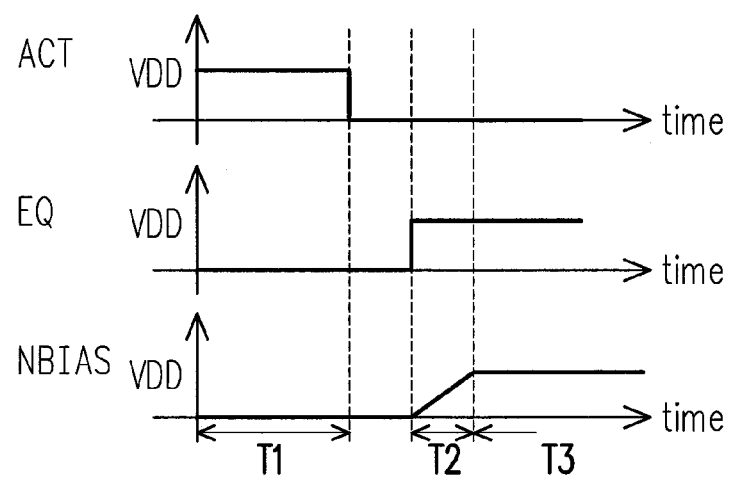
Figure 3D:
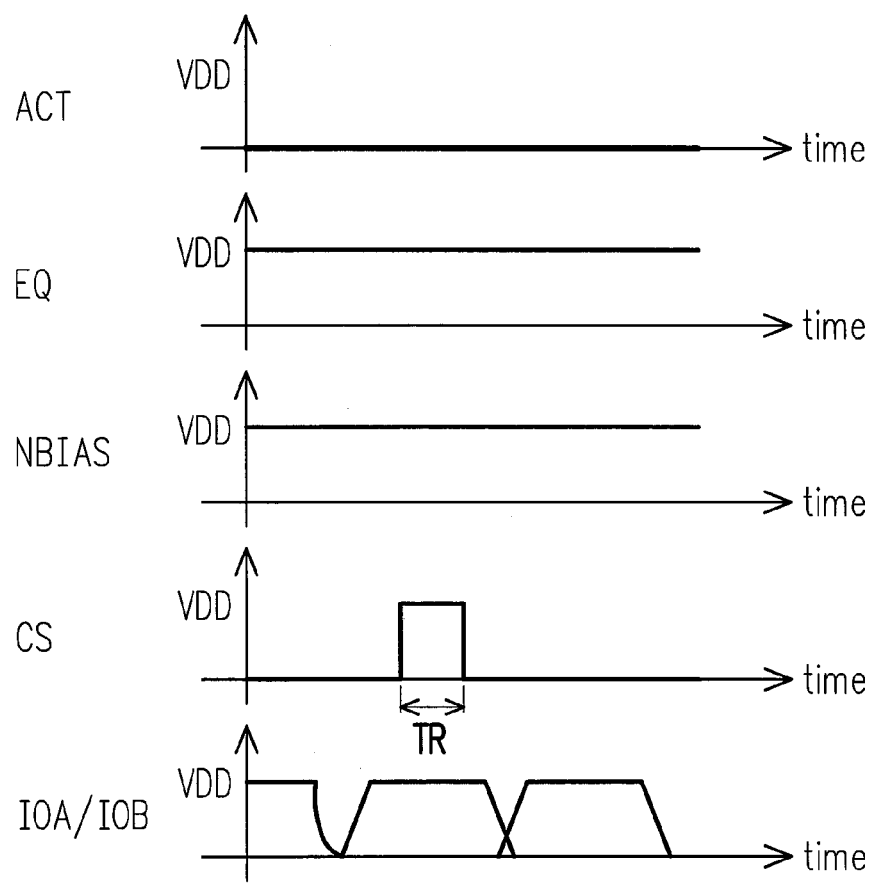

Please refer to FIG. 3B-FIG. 3D, wherein, FIG. 3B-3D are a waveforms of the sense amplifier 300 according to an embodiment of the present invention. In FIG. 3B, when a read command is processed in the sense amplifier 300, during the time period T1, the active signal ACT is equal to logic high voltage (equal to the operating voltage VDD), and the transistors M9 is turned off, M10 and M11 are turned on accordingly. The first and second digital input signals DIGITA and DIGITB are pulled up to equal to the reference voltage DVC, wherein, a voltage level of the reference voltage DVC may be smaller than a voltage level of the operating voltage VDD. Besides, the transistors M3 and M4 of the second cross-coupled transistor pair 320 are held off by biasing the reference voltage DVC which is above the threshold voltage of transistors M3 and M4.

The active signal ACT is pulled down to equal to logic low voltage when the time period T1 is finished. Notice here, during the time period T1, The equalize signal EQ is low to equal the operating voltage GND and the first and second output ends EO1 and EO2 are equalized. Moreover, during the time period T2, the equalize signal EQ is pulled up to be equal to logic high voltage (equal to the operating voltage VDD), and the transistor MEQ is turned off accordingly. During the time period T3, the bias voltage NBIAS is pulled up to be equal to the operating VDD after the first and second output ends EO1 and EO2 are equalized. Correspondingly, the first and second current sources 330 and 340 generate bias currents for flowing through the transistors M3 and M4 respectively.

When the first and second digital input signals DIGITA and DIGITB are sent from a corresponding memory cell, the voltage levels of the first and second digital input signals DIGITA and DIGITB are reduced. At this time, one of the transistors M3 and M4 is turned on (the other one is turned off), and one of the transistors M1 and M2 is turned on (the other one is turned off), and voltage levels on the first and second output ends EO1, EO2 swing to a rail.

In FIG. 3C, when a read command is processed in the sense amplifier 300, the bias voltage NBIAS may be pulled up with a ramp wave in the time period T3. Such as that, the currents generated by the first and second current sources 330 and 340 increases smoothly, and an electromagnetic interference (EMI) caused by the sense amplifier 300 can be reduced.

In FIG. 3D, when a write command is processed in the sense amplifier 300, the active signal ACT is taken to GND, the equalize signal EQ and the bias signal NBIAS are kept to be equal to the operating voltage VDD. When the control signal CS is pulled high (equal to the operating voltage) during a time period TR, the data on the first IO signal IOA or the second IO signal IOB can be written to the sense amplifier 300.

Figure 4A:
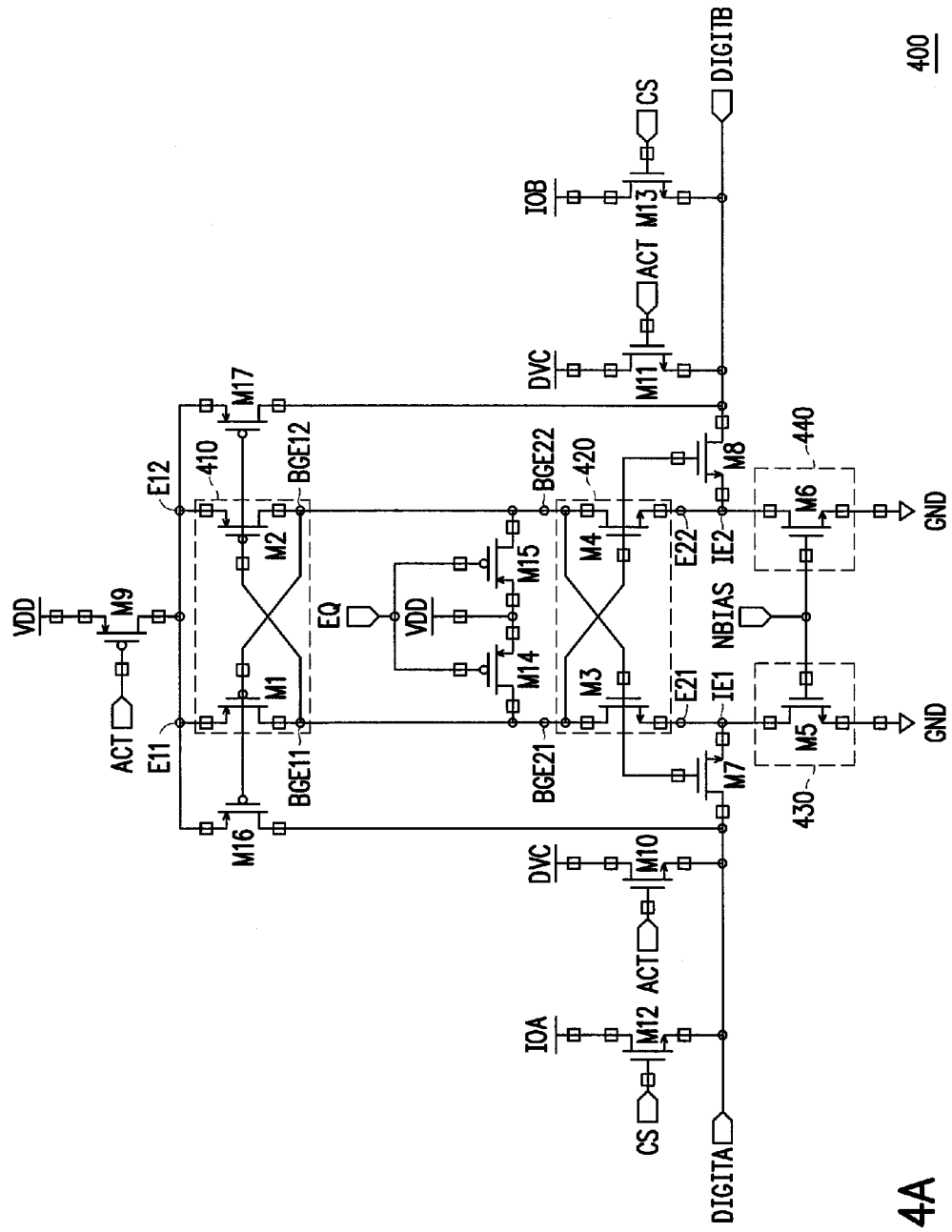
FIG. 4A is a circuit diagram of a sense amplifier 400 according to an embodiment of the present invention.

Referring to FIG. 4A, FIG. 4A is a circuit diagram of a sense amplifier 400 according to an embodiment of the present invention. The sense amplifier 400 includes a first cross-coupled transistor pair 410, a second cross-coupled transistor pair 420, a first current source 430, a second current source 440, digital input transistors M7 and M8 and first and second IO transistors M12 and M13. The sense amplifier 400 further includes a first to third active switches respectively composed of transistors M9-M11, and first and second equalize switches respectively composed of transistors M14 and M15. Different from the sense amplifier 100 in FIG. 1A, the first and second IO transistors M12 and M13 of the sense amplifier 400 are respectively coupled to the first and second digital ends for receiving the first and second digital input signals DIGITA and DIGITB.

Figure 4B:
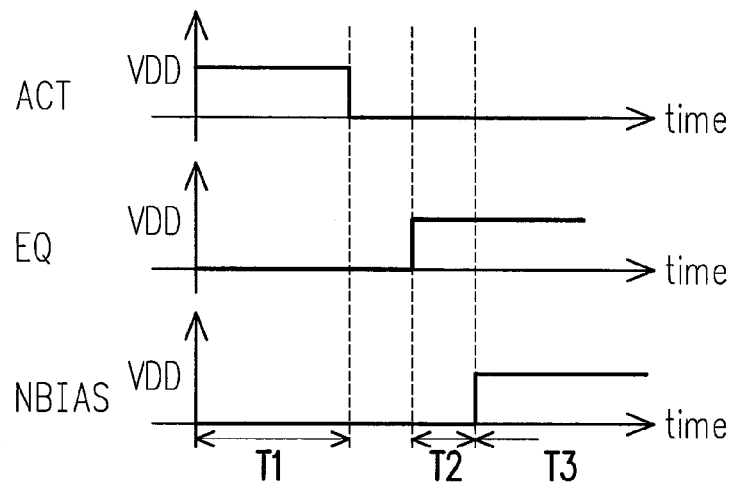
FIG. 4B and FIG. 4C are waveforms when the sense amplifier 400 is processing a read command.
Figure 4C:
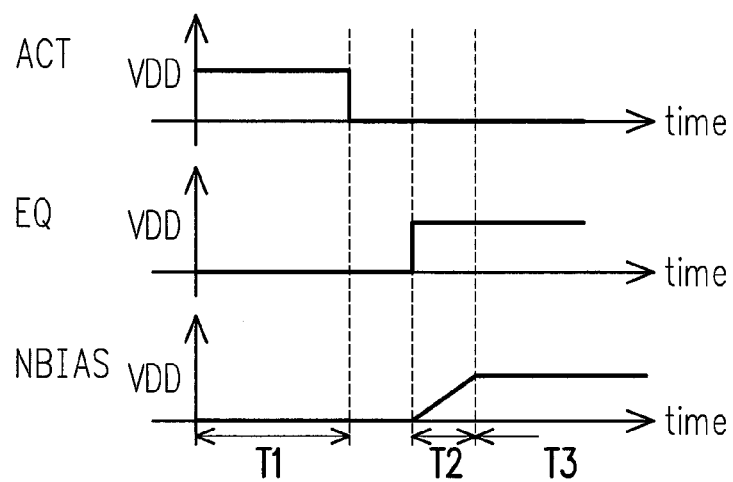
Figure 4D:
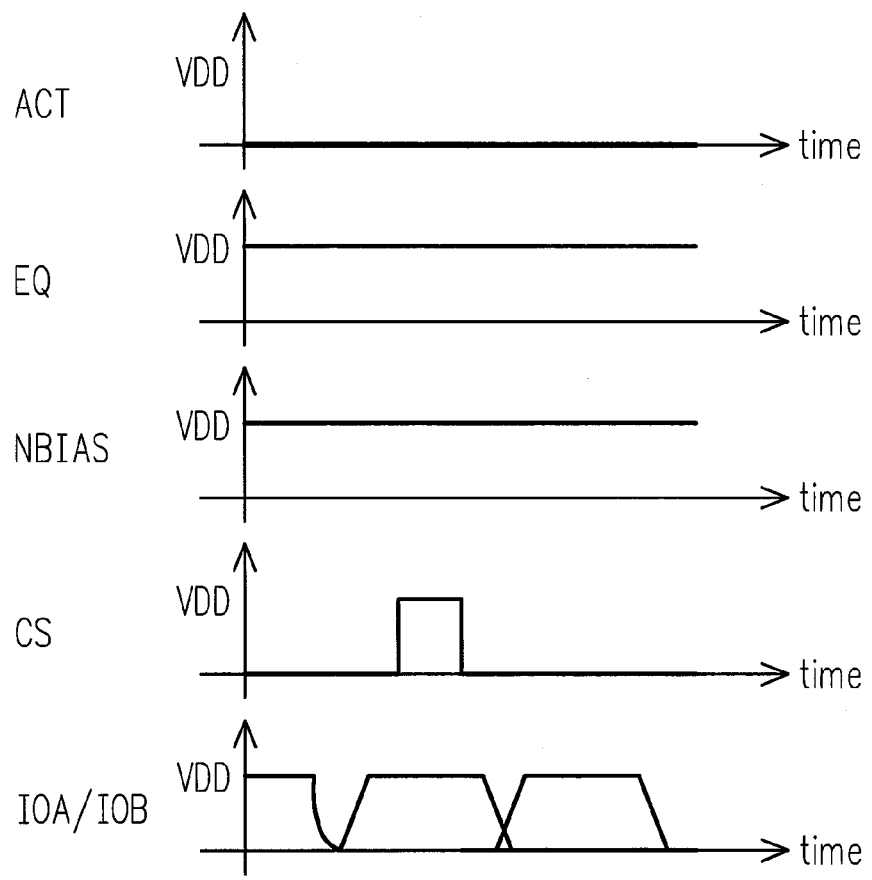
FIG. 4D is a waveform when the sense amplifier 400 is processing a write command.

Referring to FIGS. 4B-4D, FIG. 4B and FIG. 4C are waveforms when the sense amplifier 400 is processing a read command. FIG. 4D is waveform when the sense amplifier 400 is processing a write command. The operations of the sense amplifiers 100 and 400 for processing the read commands are the same. When the write command is processed in the sense amplifier 400, the data on the first or second IO signals IOA or IOB are respectively written to the first and second digital ends according to the control signal CS.

Figure 5A:
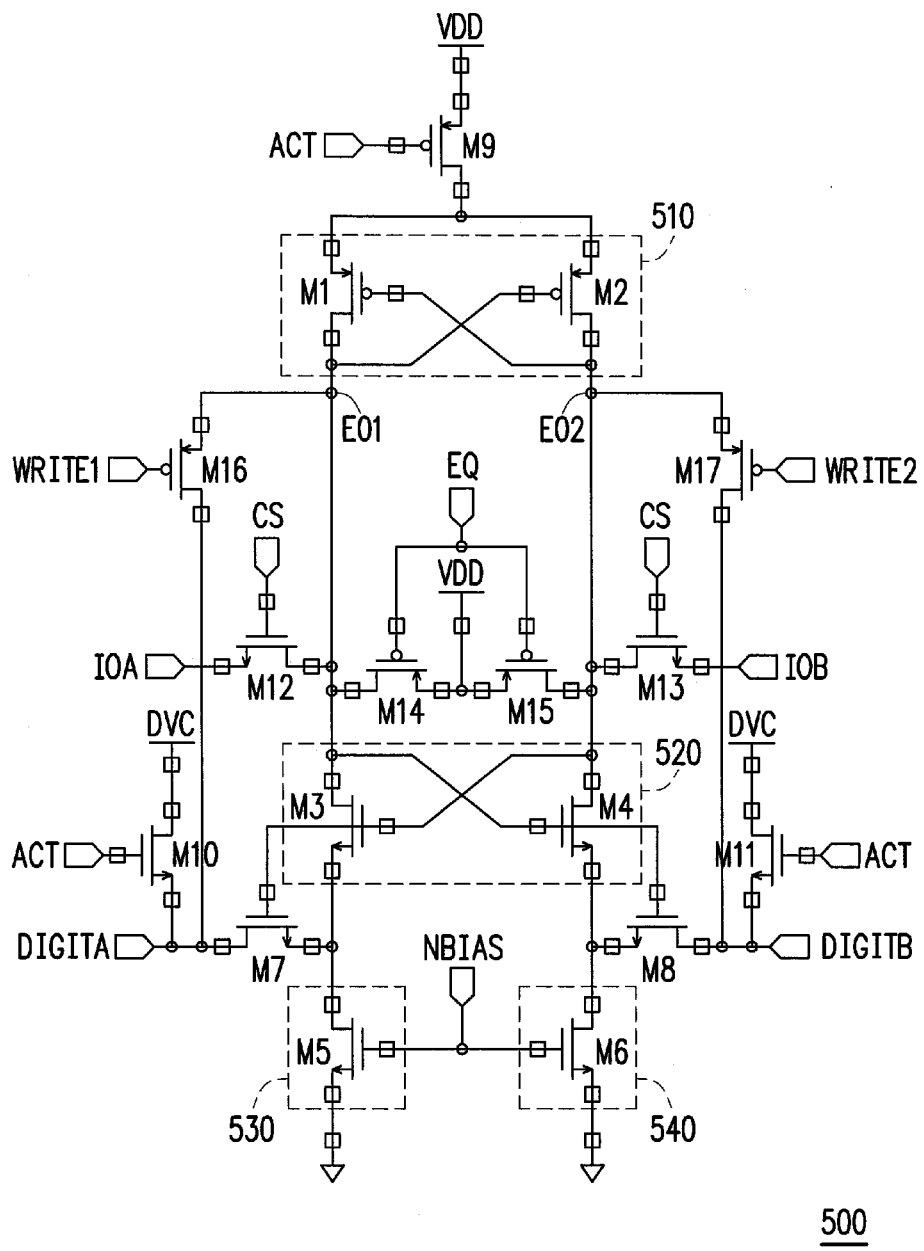
FIG. 5A is a circuit diagram of a sense amplifier 500 according to an embodiment of the present invention.

Referring to FIG. 5A, FIG. 5A is a circuit diagram of a sense amplifier 500 according to an embodiment of the present invention. The sense amplifier 500 includes a first cross-coupled transistor pair 510, a second cross-coupled transistor pair 520, a first current source 530, a second current source 540, digital input transistors M7 and M8 and a first and second IO transistors M12 and M13. The sense amplifier 500 further includes a first to third active switches respectively composed of transistors M9-M11, a first and second equalize switches respectively composed of transistors M14 and M15, and a first and second write back switches respectively composed of transistors M16 and M17. The transistors M9-M11 are controlled by the active signal ACT, the transistors M14 and M15 are controlled by an equalize signal EQ, and the transistors M16 and M17 are respectively controlled by write back signals WRITE1 and WRITE2.

The transistors M14 and M15 are coupled to the operating voltage VDD and one end of the transistors M14 and M15 are respectively coupled to the first output end EO1 and the second output end EO2. The control ends of the transistors M14 and M15 are coupled to the equalize signal EQ. A first and second ends of the transistor M16 are coupled to the first output end EO1 and the first input digital signal DIGITA, a first and second ends of the transistor M17 are coupled to the second output end EO2 and the second input digital signal DIGITB. The control ends of the transistor M16 and M17 respectively receive the write back signal WRITE1 and WRITE2.

About the operation of the sense amplifier 500, at first, the first digital input signal DIGITA and the second digital input signal DIGITB are pulled up to equal to the reference voltage DVC by turning on the transistors M10 and M11, and the coupled end of the first cross-coupled transistor pair 510 and the transistor M9 is pulled up to equal to the operating voltage VDD. Then, the sense amplifier 500 is turned on before a set of corresponding memory cells is activated by pulling the active signal ACT to logic low level, and the pre-charging path for the first digital input signal DIGITA and the second digital input signal DIGITB to the reference voltage DVC is turned off correspondingly. Furthermore, the equalize signal EQ is activated (pulled down to equal to the ground voltage GND), such as that the transistors M14 and M15 are turned on, and the first and second output ends EO1 and EO2 are pre-charged to equal the operating voltage VDD. Besides, the equalize signal EQ is released following the active signal ACT transition by pulling high.

At this time, since the N-type transistors M3 and M4 are biased by the reference voltage DVC which is above the threshold voltage of transistors M3 and M4, the transistors M3 and M4 are held in off state. Moreover, when a memory cell charge propagates to the sense amplifier 500, the bias voltage NBIAS is pulled up to logic high level (equal to the operating voltage VDD, for example) and the current sources 530 and 540 are turned on.

Since the first digital input signal DIGITA and the second digital input signal DIGITB sent from memory cell are differential signal. The voltage level of one of the first digital input signal DIGITA and the second digital input signal DIGITB is reduced more rapidly, and one of the transistor M3 and M4 is turned on, and one of the transistors M1 and M2 is turned on. If the transistor M3 is turned on, the transistor M2 is turned on correspondingly, and the transistors M4 and M1 are turned off. If the transistor M4 is turned on, the transistor M1 is turned on correspondingly, and the transistors M3 and M2 are turned off. A sensing decision of the sense amplifier 500 is made according to the turn-on turn-off statuses of transistors M1-M4 for causing the first and second output ends EO1 and EO2 swing to the rails. That is, the sensing result is generated at the first and second output ends EO1 and EO2.

Please notice here, the sense amplifier 500 further includes first and second write back switches composed of transistors M16 and M17. In the operation of sense amplifier 500, if one of the first and second write back signals WRITE1 and WRITE2 is pulled down and a voltage on one of the first and second output ends EO1 and EO2 is written back to the first digital input signal DIGITA or the second digital input signal DIGITB. In detail, when the first write back signal WRITE1 is pulled down, the voltage on the first output end EO1 is written back to the first digital input signal DIGITA, and when the second write back signal WRITE2 is pulled down, the voltage on the first output end EO1 is written back to the second digital input signal DIGITB.

In this embodiment, the write back signal WRITE1 and WRITE2 are isolated, and a one bit write back operation can be operated. Therefore, the power consumption of the sense amplifier 500 can be minimized.

Figure 5B:
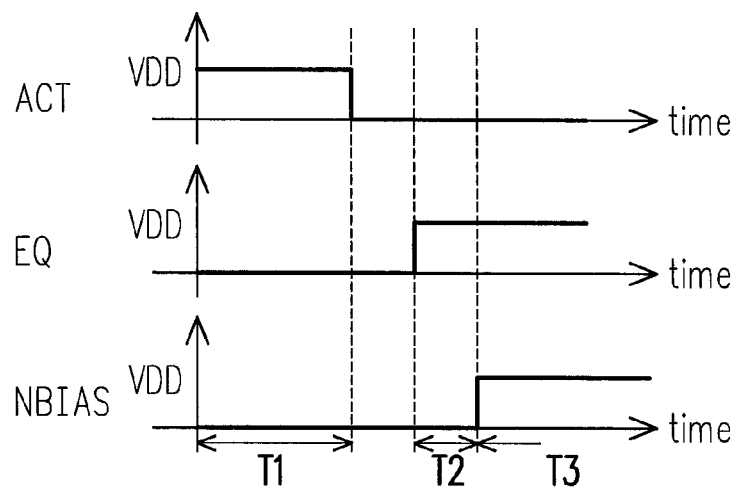
FIG. 5B and FIG. 5C are waveforms when the sense amplifier 500 is processing a read command.
Figure 5C:
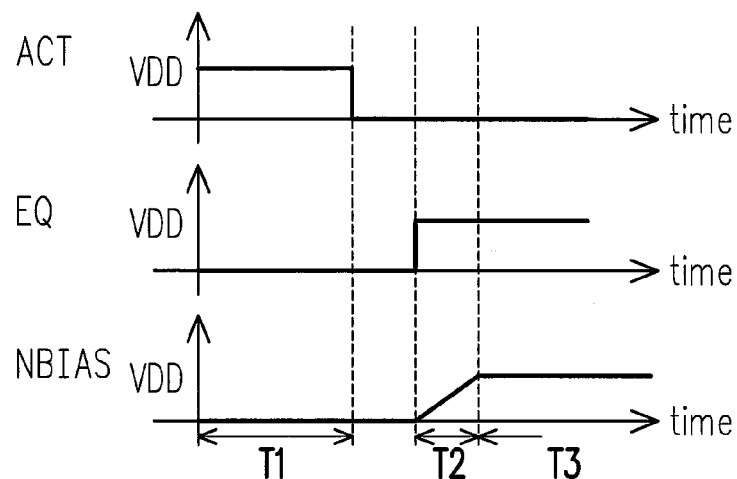
Figure 5D:
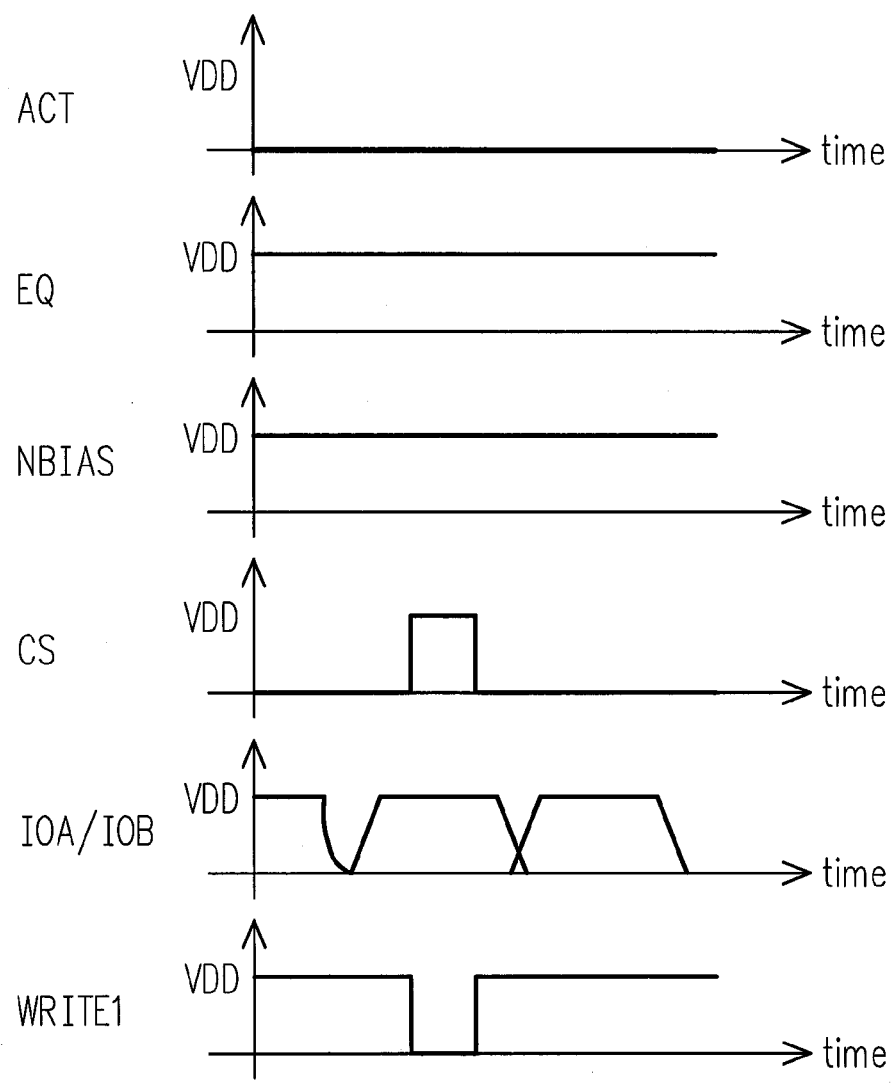
FIG. 5D is a waveform when the sense amplifier 500 is processing a write command.

Referring to FIGS. 5B-5D, FIG. 5B and FIG. 5C are waveforms when the sense amplifier 500 is processing a read command. FIG. 5D is waveform when the sense amplifier 500 is processing a write command. The operations of the sense amplifiers 100 and 500 for processing the read commands are the same. In FIG. 5D, when the control signal CS is pulled high, the data on the first or second IO signals is written to one of the first and second output ends EO1 and EO2. Besides, when the write back signal WRITE1 is pulled low, the data of the first output end EO1 is written back to the first digital end.

Figure 6A:
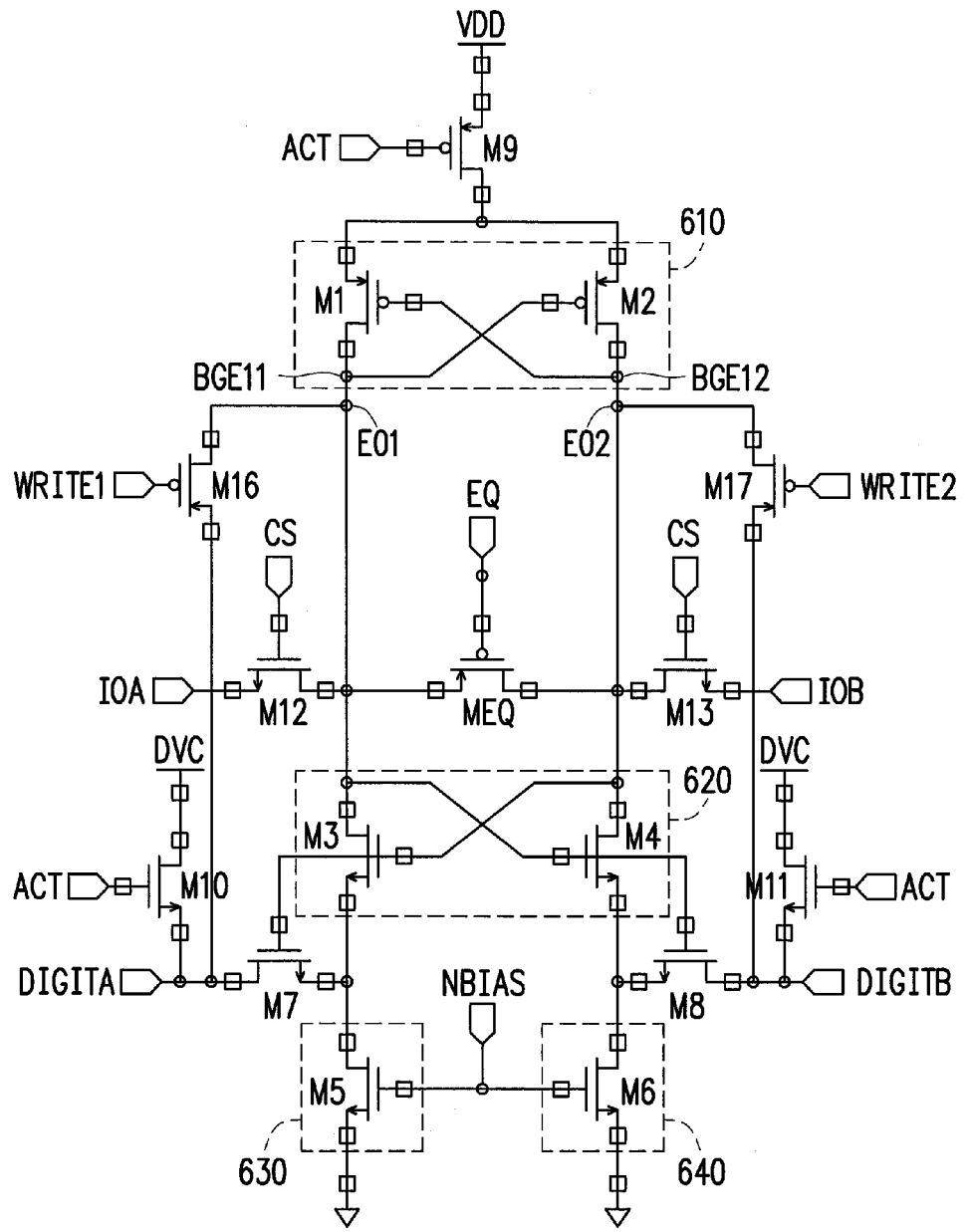
FIG. 6A is a circuit diagram of a sense amplifier 600 according to an embodiment of the present invention.

Referring to FIG. 6A, FIG. 6A is a circuit diagram of a sense amplifier 600 according to an embodiment of the present invention. The sense amplifier 600 includes a first cross-coupled transistor pair 610, a second cross-coupled transistor pair 620, a first current source 630, a second current source 640, digital input transistors M7 and M8 and a first and second IO transistors M12 and M13. The sense amplifier 600 further includes a first to third active switches respectively composed of transistors M9-M11, a equalize switch composed of transistor MEQ, and a first and second write back switches respectively composed of transistors M16 and M17. The transistors M9-M11 are controlled by the active signal ACT, the transistor MEQ is controlled by an equalize signal EQ, and the transistors M16 and M17 are respectively controlled by write back signals WRITE1 and WRITE2.

Figure 6B:
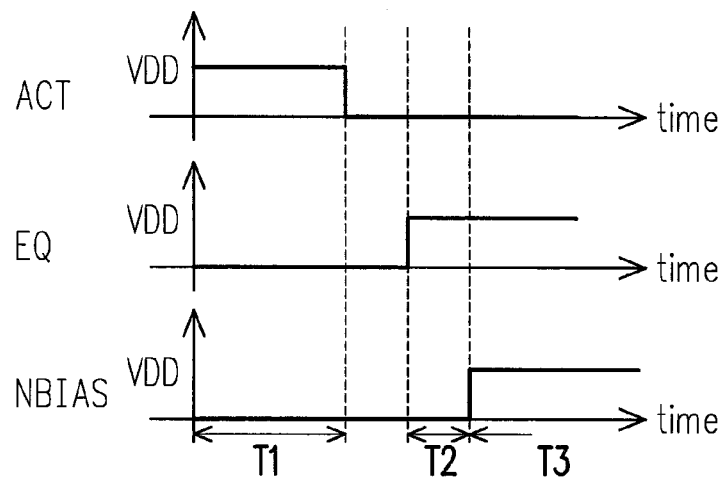
FIG. 6B and FIG. 6C are waveforms when the sense amplifier 600 is processing a read command.
Figure 6C:
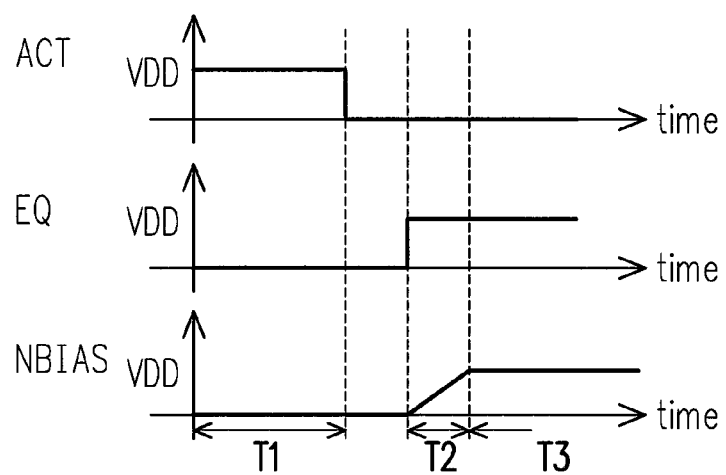
Figure 6D:
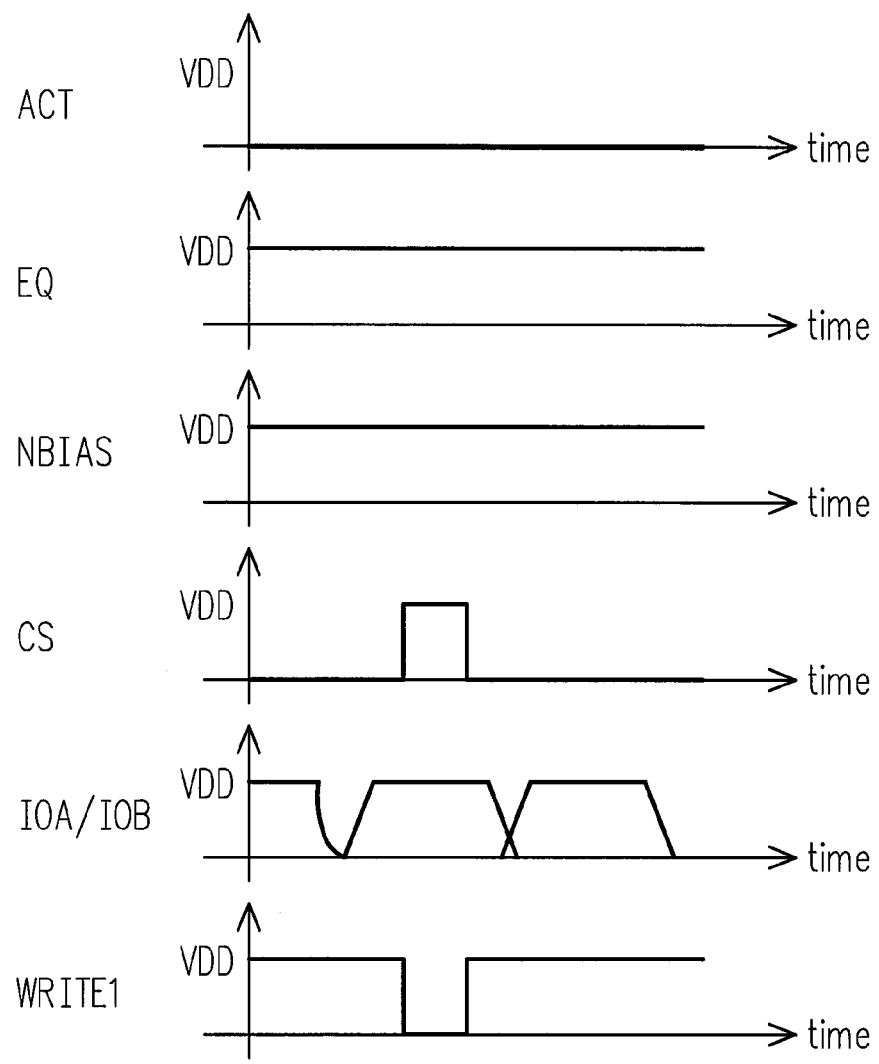
FIG. 6D is a waveform when the sense amplifier 600 is processing a write command.

Referring to FIGS. 6B-6D, FIG. 6B and FIG. 6C are waveforms when the sense amplifier 600 is processing a read command. FIG. 6D is waveform when the sense amplifier 600 is processing a write command. The operations of the sense amplifiers 500 and 600 for processing the read commands are the same. In FIG. 6D, when the control signal CS is pulled high, the data on the first or second IO signals is written to one of the first and second output ends EO1 and EO2. Besides, when the write back signal WRITE1 is pulled low, the data of the first output end EO1 is written back to the first digital end.

Figure 6E:
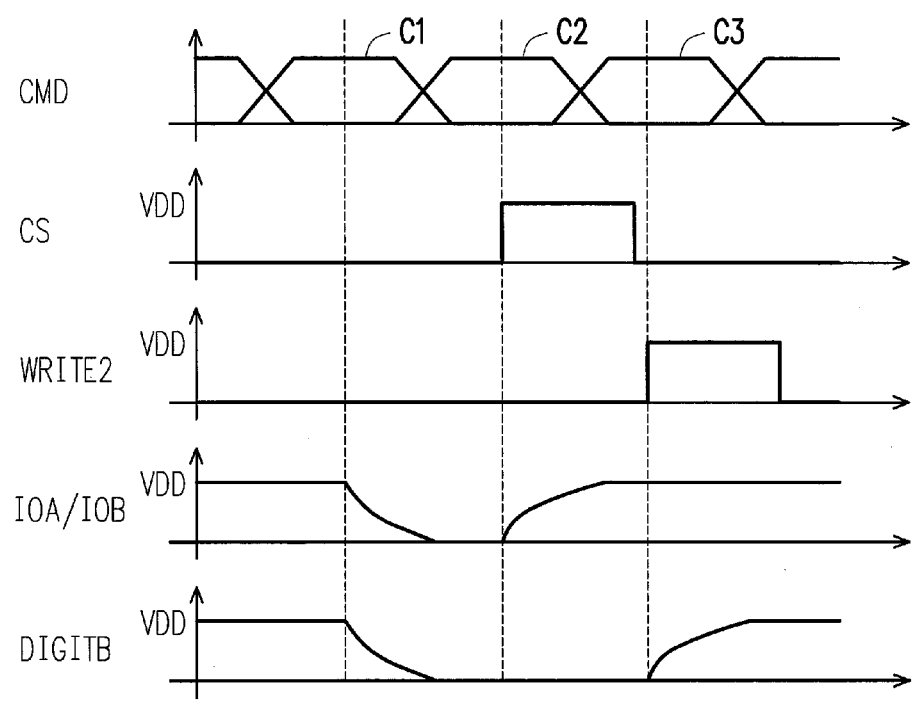
FIG. 6E illustrates waveform plot of the sense amplifier 600.

Referring to FIG. 6E, wherein FIG. 6E illustrates waveform plot of the sense amplifier 600. In this embodiment, a plurality of commands CMD are transporting to the sense amplifier 600. In FIG. 6E, the voltage on the second output end EO2 is written back to the second digital input signal DIGITB after a pre-charge command C3 is initiated. A write command C2 is only for writing the first and second IO signals IOA and IOB to the first and second output end EO1 and EO2 respectively according to the control signal CS. That is, when the control signal CS is pulsed, data from the first and second IO signals IOA and IOB are written to the first and second output end EO1 and EO2. The first and second output end EO1 and EO2 are held by the sense amplifier 600 and the pre-charge command C3 pulls up the second write back signal WRITE2 for allowing charge to flow to the second digital input signal DIGITB. Accordingly, the voltage level of the second digital input signal DIGITB is taken to the desired voltage level obtained from the IO when the second write back signal WRITE2 is equal to logic high level.

During one activate to pre-charge cycle the write command can be issued multiple times modifying the data held at the first and second output ends EO1 and EO2. The first and second digital input signals DIGITA and/or DIGITB may be modified when the first and/or second write back signal WRITE1 and/or WRITE2 rises to logic high level.

Figure 7A:
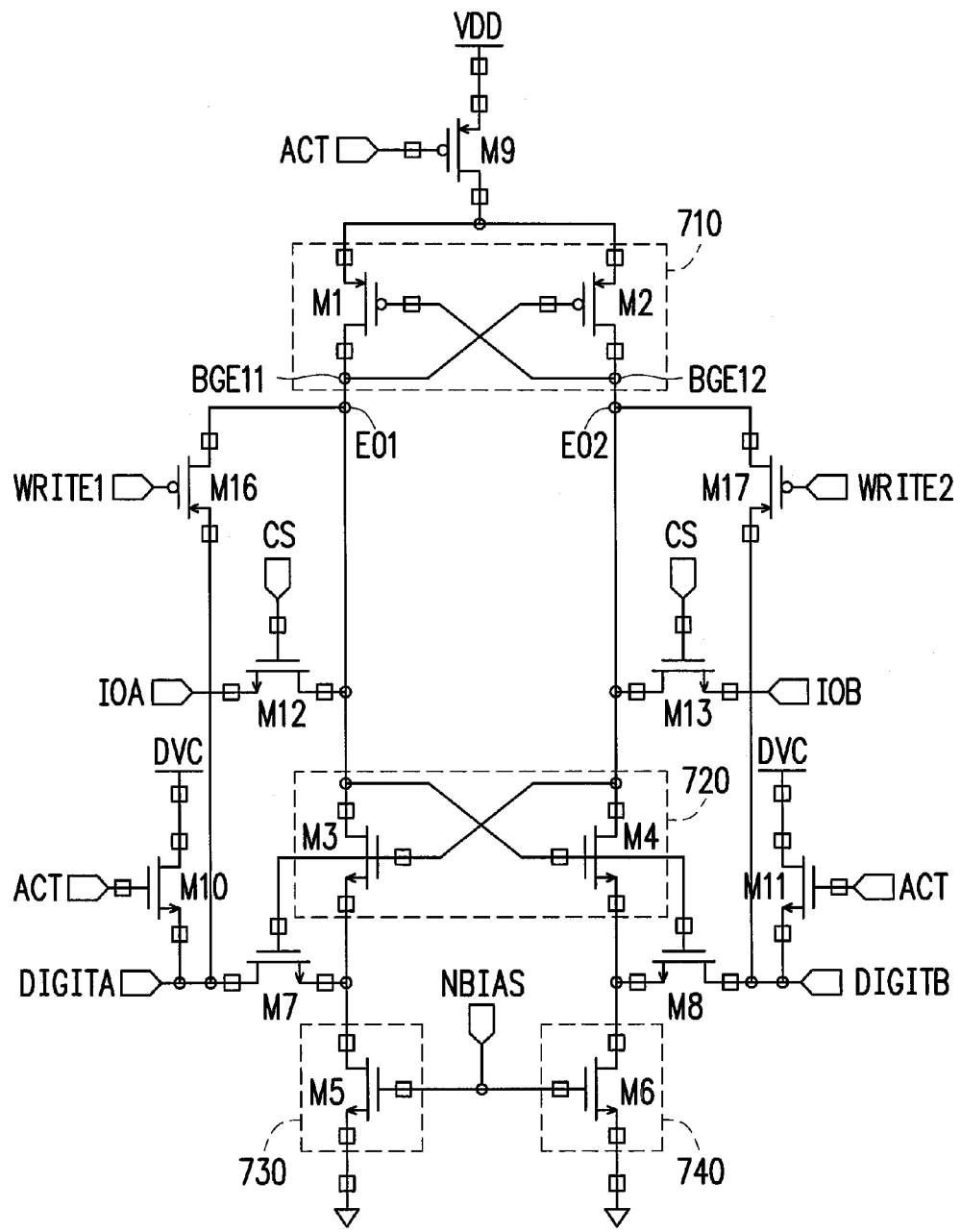
FIG. 7A is a circuit diagram of a sense amplifier 700 according to an embodiment of the present invention.

Referring to FIG. 7A, FIG. 7A is a circuit diagram of a sense amplifier 700 according to an embodiment of the present invention. The sense amplifier 700 includes a first cross-coupled transistor pair 710, a second cross-coupled transistor pair 720, a first current source 730, a second current source 740, digital input transistors M7 and M8 and a first and second IO transistors M12 and M13. The sense amplifier 700 further includes a first to third active switches respectively composed of transistors M9-M11, and a first and second write back switches respectively composed of transistors M16 and M17. The transistors M9-M11 are controlled by the active signal ACT, and the transistors M16 and M17 are respectively controlled by write back signals WRITE1 and WRITE2. Different from the sense amplifier 600 in FIG. 6, there is no equalize switch disposed in the sense amplifier 700. Please notice here, the first and second output ends EO1 and EO2 may be equalized by turning on the first and second IO transistor M12 and M13 through the control signal CS, and allowing the ends of the first and second IO transistor M12 and M13 for receiving the first and second IO signals IOA and IOB.

Figure 7B:
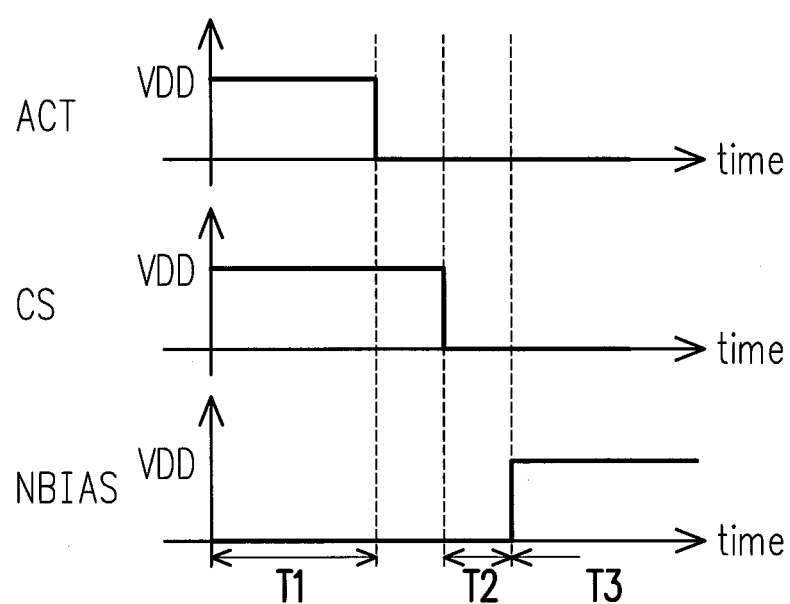
FIG. 7B is a waveform when the sense amplifier 700 is processing a read command.
Figure 7C:
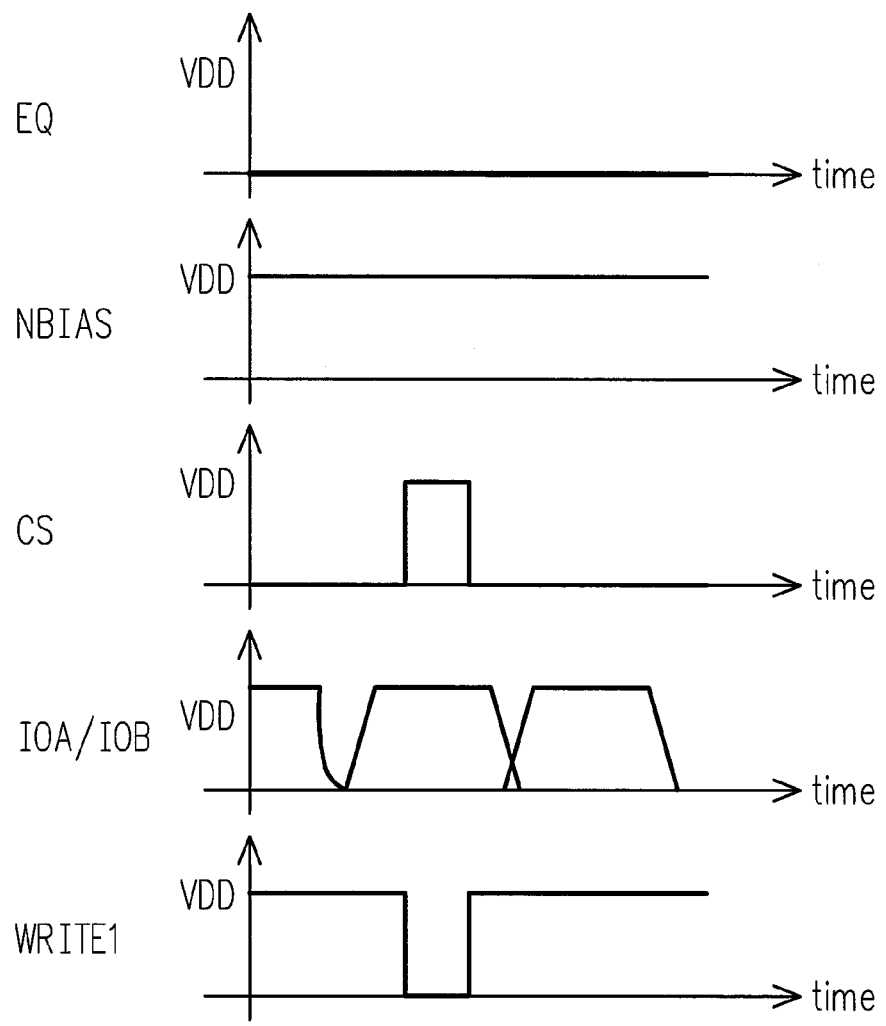
FIG. 7C is a waveform when the sense amplifier 700 is processing a write command.

Referring to FIGS. 7B-7C, FIG. 7B is a waveform when the sense amplifier 700 is processing a read command. FIG. 7C is a waveform when the sense amplifier 700 is processing a write command. The operations of the sense amplifiers 100 and 700 for processing the read commands are the same. In FIG. 7C, when the control signal CS is pulled high, the data on the first or second IO signals is written to one of the first and second output ends EO1 and EO2. Besides, when the write back signal WRITE1 is pulled low, the data of the first output end EO1 is written back to the first digital end.

Figure 8A:
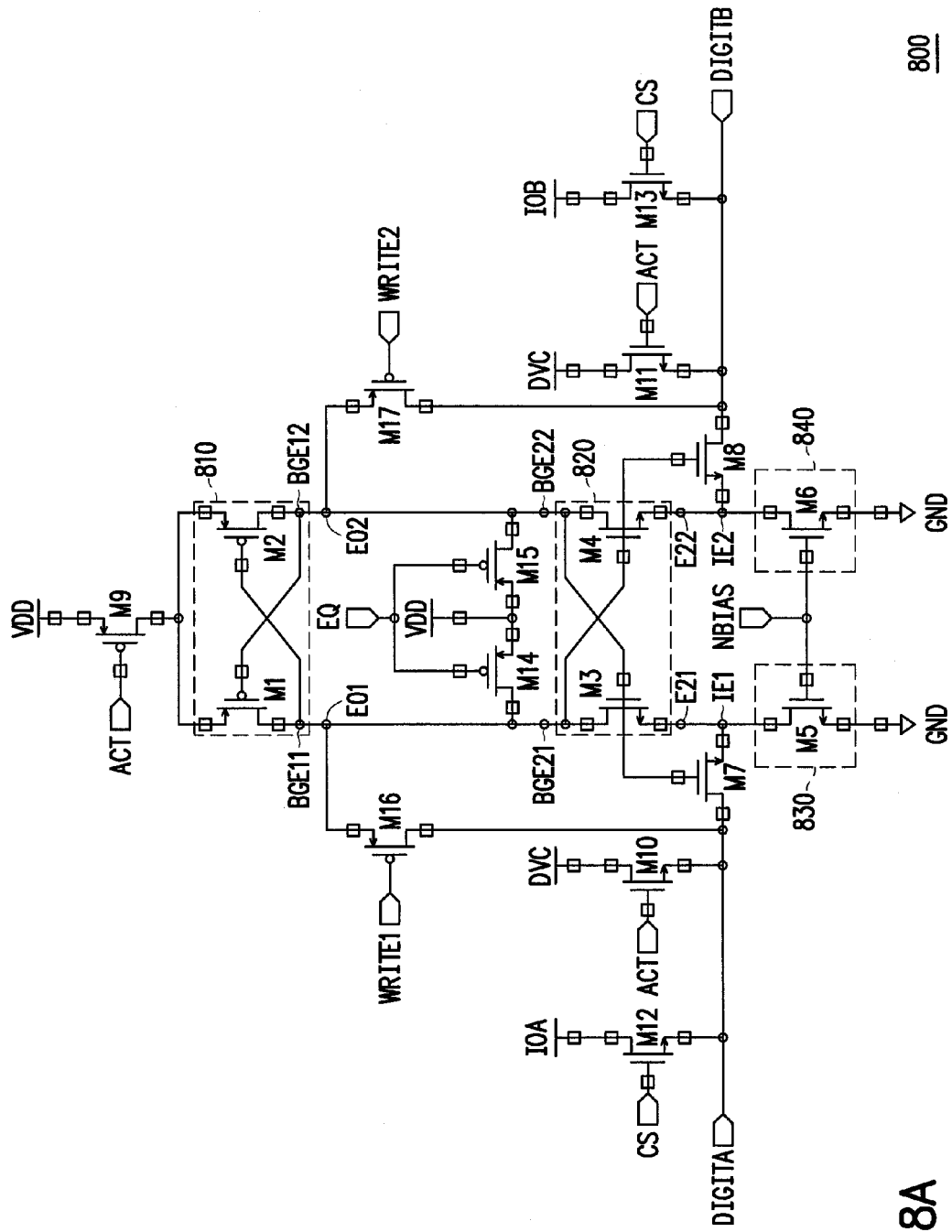
FIG. 8A is a circuit diagram of a sense amplifier 800 according to an embodiment of the present invention.

Referring to FIG. 8A, FIG. 8A is a circuit diagram of a sense amplifier 800 according to an embodiment of the present invention. The sense amplifier 800 includes a first cross-coupled transistor pair 810, a second cross-coupled transistor pair 820, a first current source 830, a second current source 840, digital input transistors M7 and M8 and a first and second IO transistors M12 and M13. The sense amplifier 800 further includes a first to third active switches respectively composed of transistors M9-M11, a first and second equalize switches respectively composed of transistors M14 and M15, and a first and second write back switches respectively composed of transistors M16 and M17. The transistors M9-M11 are controlled by the active signal ACT, the transistors M14 and M15 are controlled by an equalize signal EQ, and the transistors M16 and M17 are respectively controlled by write back signals WRITE1 and WRITE2.

The transistors M14 and M15 are coupled to the operating voltage VDD and one end of the transistors M14 and M15 are respectively coupled to the first output end EO1 and the second output end EO2. The control ends of the transistors M14 and M15 are coupled to the equalize signal EQ. A first and second ends of the transistor M16 are coupled to the first output end EO1 and the first input digital signal DIGITA, a first and second ends of the transistor M17 are coupled to the second output end EO2 and the second input digital signal DIGITB. The control ends of the transistor M16 and M17 respectively receive the write back signal WRITE1 and WRITE2.

About the operation of the sense amplifier 800, at first, the first digital input signal DIGITA and the second digital input signal DIGITB are pulled up to equal to the reference voltage DVC by turning on the transistors M10 and M11. Then, the sense amplifier 800 is turned on before a word line of corresponding memory cells is activated by pulling the active signal ACT to logic low level, and the pre-charging path for the first digital input signal DIGITA and the second digital input signal DIGITB to the reference voltage DVC is turned off correspondingly. At this time the coupled end of the first cross coupled transistor pair 810 and the transistor M9 are pulled up to equal the operating voltage VDD. Furthermore, the equalize signal EQ is deactivated (pulled up to equal to the ground voltage VDD), such as that the transistors M14 and M15 are turned off, and the first and second output ends EO1 and EO2 are released from the pre-charged state equal to the operating voltage VDD.

At this time, since the N-type transistors M3 and M4 are biased by the reference voltage DVC which is above the threshold voltage of transistors M3 and M4, the transistors M3 and M4 are held in off state. Moreover, when a memory cell charge propagates to the sense amplifier 800, the bias voltage NBIAS is pulled up to logic high level (equal to the operating voltage VDD, for example) and the current sources 830 and 840 are turned on.

Since the first digital input signal DIGITA and the second digital input signal DIGITB sent from memory cell are a differential signal. The voltage level of one of the first digital input signal DIGITA and the second digital input signal DIGITB is reduced more rapidly, and one of the transistor M3 and M4 is turned on, and one of the transistors M1 and M2 is turned on. If the transistor M3 is turned on, the transistor M2 is turned on correspondingly, and the transistors M4 and M1 are turned off. If the transistor M4 is turned on, the transistor M1 is turned on correspondingly, and the transistors M3 and M2 are turned off. A sensing decision of the sense amplifier 800 is made according to the turn-on turn-off statuses of transistors M1-M4 for causing the first and second output ends EO1 and EO2 to swing to rails. That is, the sensing result is generated at the first and second output ends EO1 and EO2.

Please notice here, the sense amplifier 800 further includes first and second write back switches composed of transistors M16 and M17. In the operation of sense amplifier 800, if one of the first and second write back signals WRITE1 and WRITE2 is pulled down, a voltage on one of the first and second output ends EO1 and EO2 is written back to the first digital input signal DIGITA or the second digital input signal DIGITB. In detail, when the first write back signal WRITE1 is pulled down, the voltage on the first output end EO1 is written back to the first digital input signal DIGITA, and when the second write back signal WRITE2 is pulled down, the voltage on the first output end EO1 is written back to the second digital input signal DIGITB.

In this embodiment, the write back signal WRITE1 and WRITE2 are isolated, and a one bit write back operation can be operated. Therefore, the power consumption of the sense amplifier 800 can be minimized.

Figure 8B:
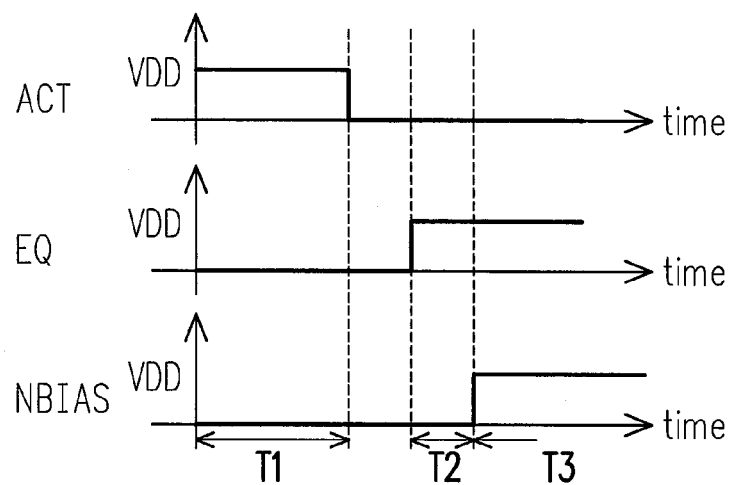
FIG. 8B and FIG. 8C are waveforms when the sense amplifier 800 is processing a read command.
Figure 8C:
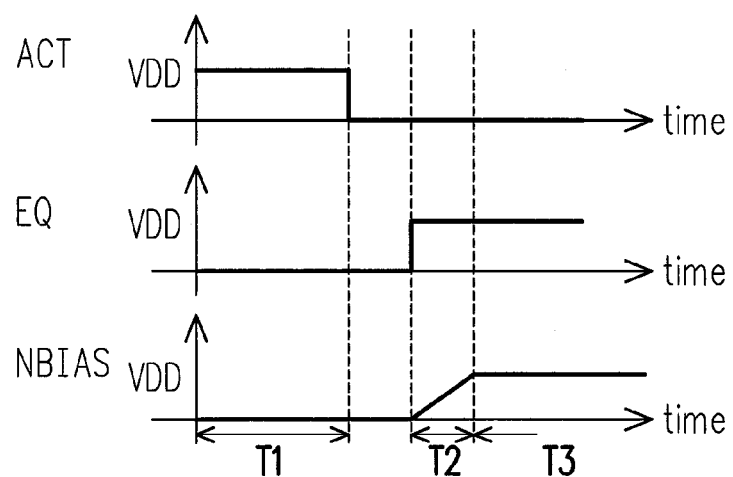
Figure 8D:
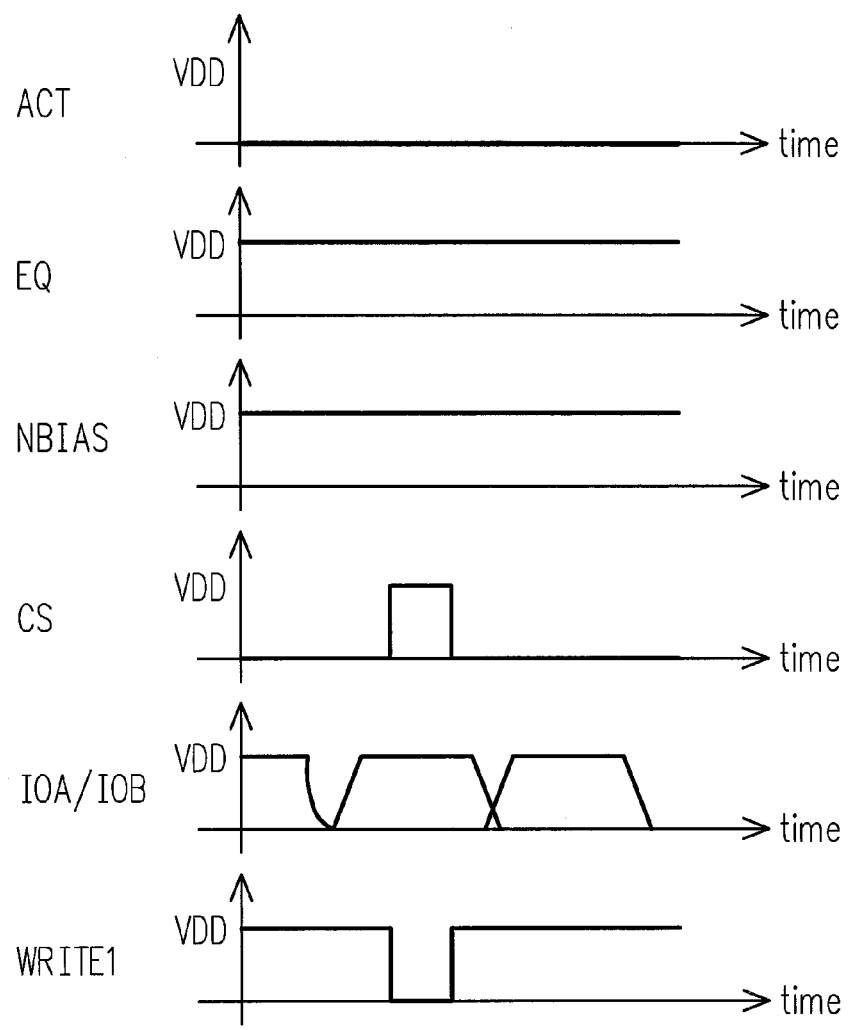
FIG. 8D is a waveform when the sense amplifier 800 is processing a write command.

Referring to FIGS. 8B-8D, FIG. 8B and FIG. 8C are waveforms when the sense amplifier 800 is processing a read command. FIG. 8D is waveform when the sense amplifier 800 is processing a write command. The waveforms in FIGS. 8B and 8C are same to the waveforms in FIG. 6B and FIG. 6C. The operations of the sense amplifiers 600 and 800 for processing the read commands are the same. In FIG. 8D, when the control signal CS is pulled high, the first and second IO signals IOA and IOB are written to the sense amplifier 800. When the write back signal WRITE1 is pulled low, the data of the first output end EO1 is written back to the first digital end.

Figure 9A:
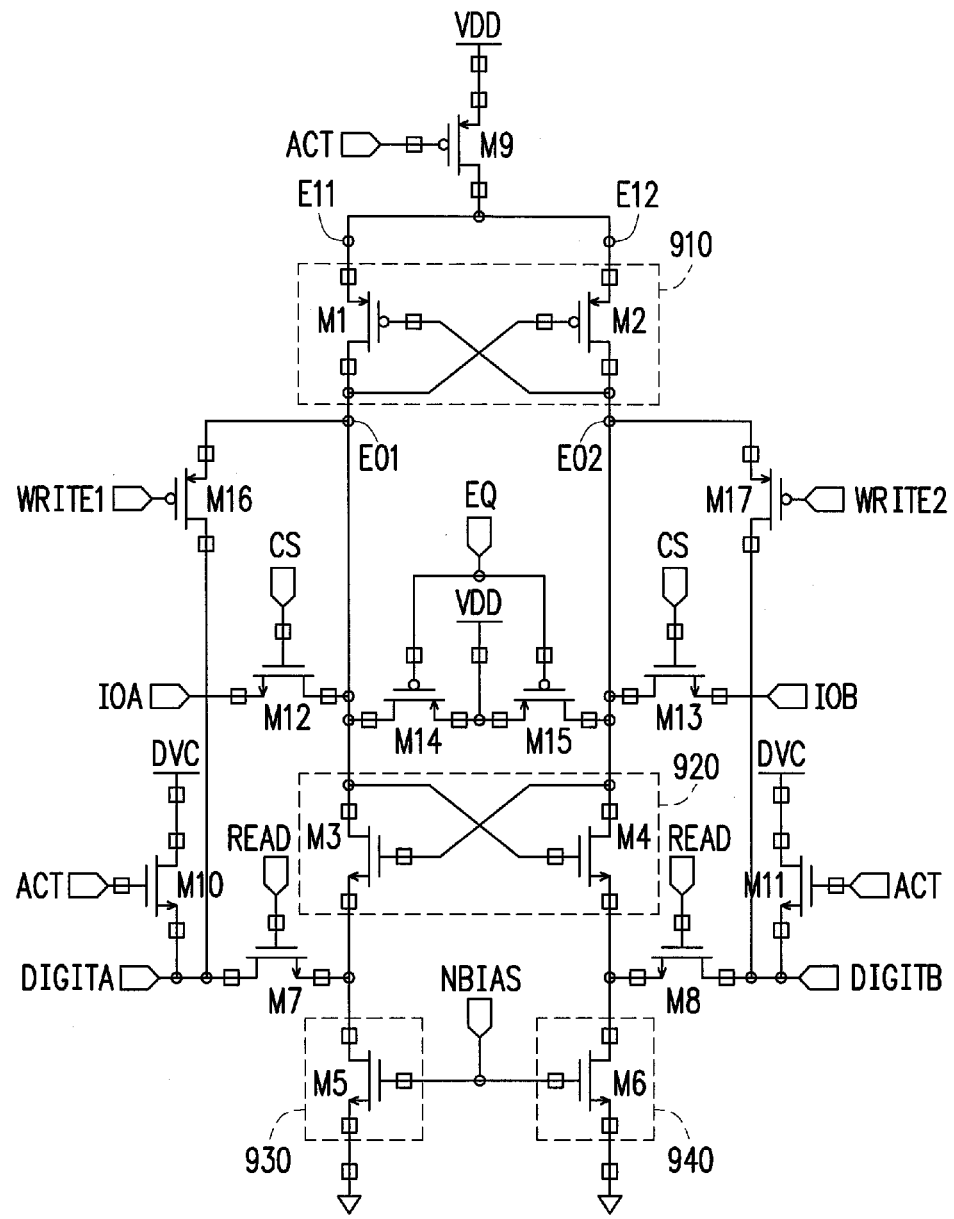
FIG. 9A is a circuit diagram of a sense amplifier 900 according to an embodiment of the present invention.

Referring to FIG. 9A, FIG. 9A is a circuit diagram of a sense amplifier 900 according to an embodiment of the present invention. The sense amplifier 900 includes a first cross-coupled transistor pair 910, a second cross-coupled transistor pair 920, a first current source 930, a second current source 940, digital input transistors M7 and M8 and a first and second IO transistors M12 and M13. The sense amplifier 900 further includes a first to third active switches respectively composed of transistors M9-M11, a first and second equalize switches respectively composed of transistors M14 and M15, and a first and second write back switches respectively composed of transistors M16 and M17. The transistors M9-M11 are controlled by the active signal ACT, the transistors M14 and M15 are controlled by an equalize signal EQ, the transistors M16 and M17 are respectively controlled by write back signals WRITE1 and WRITE2, the first and second transistors M12 and M13 are controlled by the control signal CS, and the digital input transistors M7 and M8 are controlled by a read signal READ.

Figure 9B:
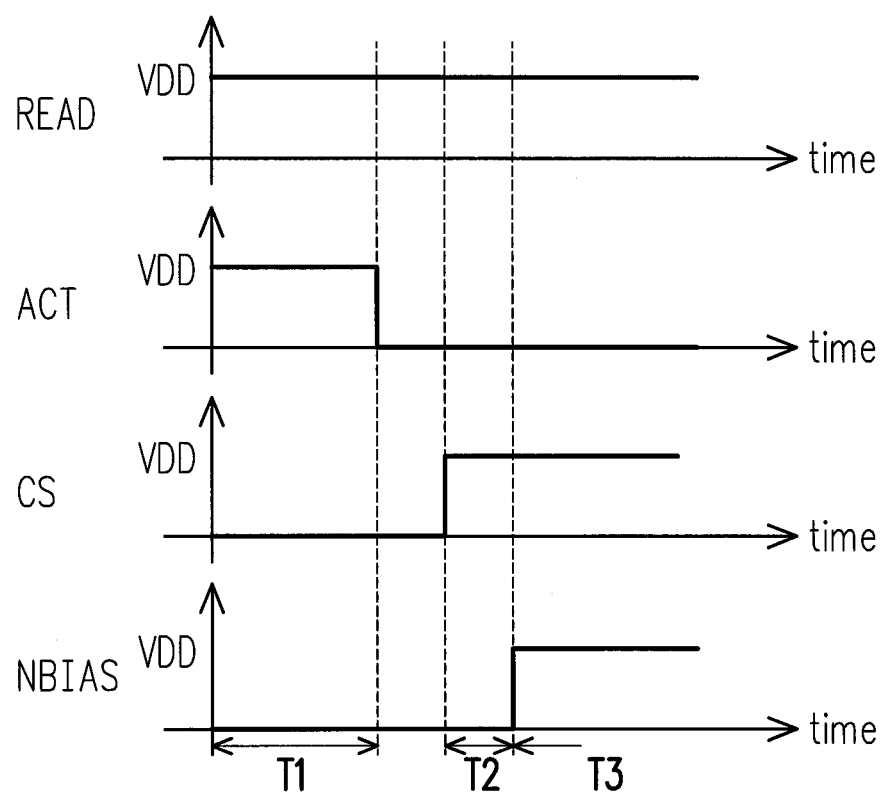
FIG. 9B and FIG. 9C are waveforms of the sense amplifier 900.
Figure 9C:
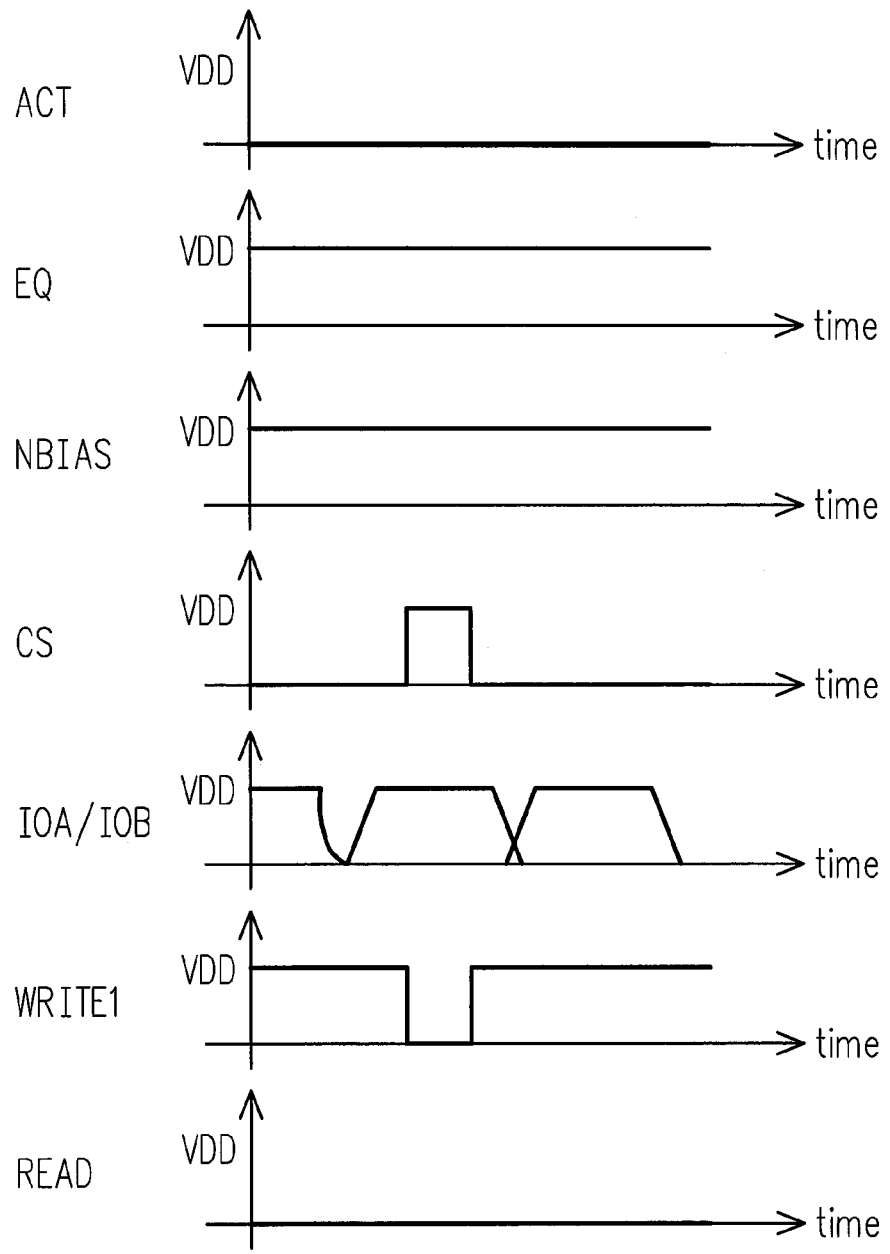

Referring to FIGS. 9B-9C, FIG. 9B and FIG. 9C are waveforms of the sense amplifier 900. In FIG. 9B, when the sense amplifier 900 is processing a read command, the read signal READ is pulled to equal to the operation voltage VDD for turning on the transistors M7 and M8. In FIG. 9C, when the sense amplifier 900 is processing a write command, the read signal READ is pulled down to ground, and the transistors M7 and M8 are turned off accordingly. In FIG. 9C, the write takes place at the same time as the data being written to the first and second output ends EO1 and EO2. In this embodiment where the writes are command driven, the control signal CS and the write back signal WRITE1 do not need to be fired during this same time period. The control signal CS can be fired before or during the write back signal WRITE1 being taken low. This allows multiple writes that would normally toggle the first digital input signal DIGITA and the second digital input signal DIGITB to only affect the first and second output ends EO1 and EO2 and the write to the first digital input signal DIGITA and the second digital input signal DIGITB to occur after any undesired transitions.

Figure 10A:
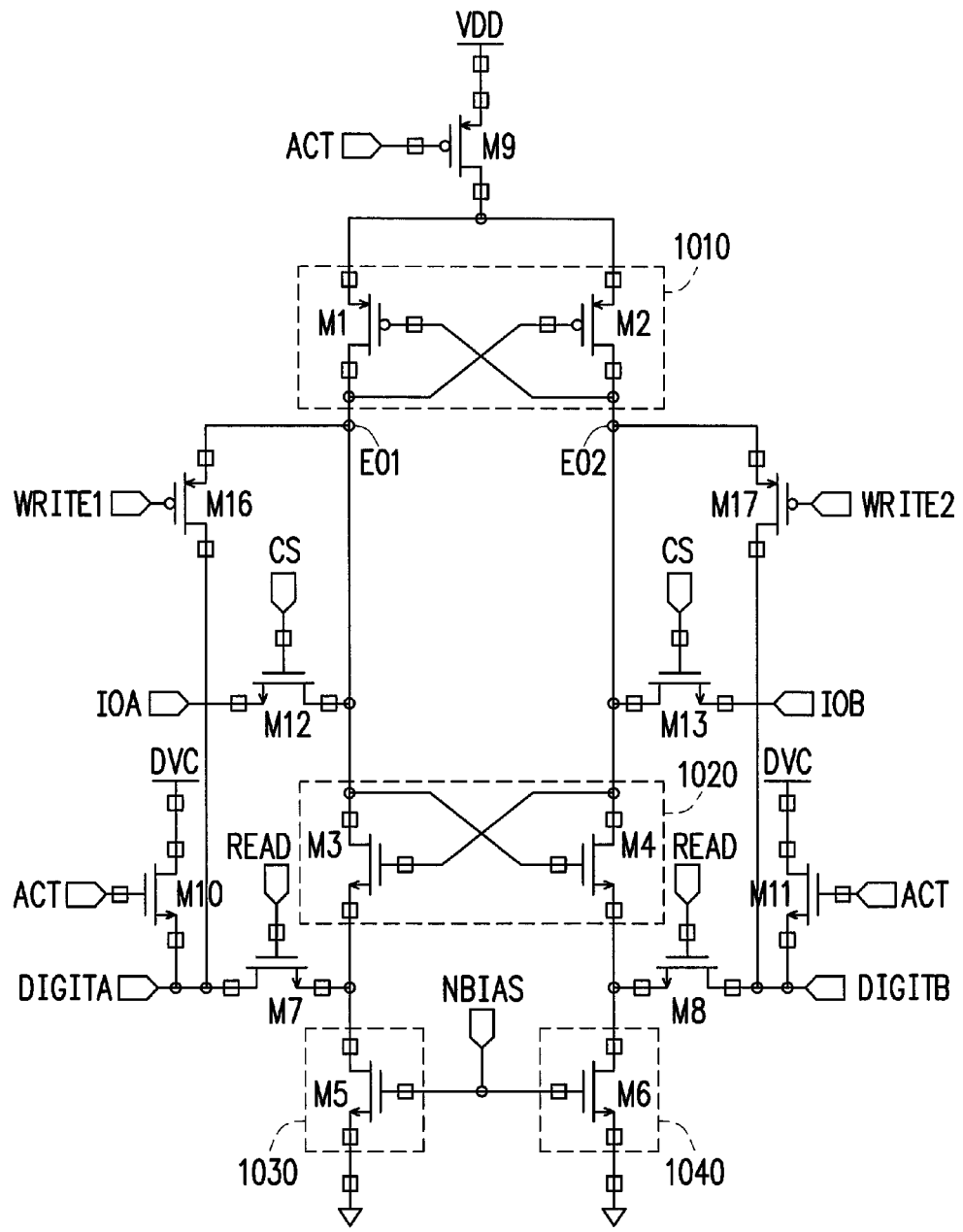
FIG. 10A is a circuit diagram of a sense amplifier 1000 according to an embodiment of the present invention.

Referring to FIG. 10A, FIG. 10A is a circuit diagram of a sense amplifier 1000 according to an embodiment of the present invention. The sense amplifier 1000 includes a first cross-coupled transistor pair 1010, a second cross-coupled transistor pair 1020, a first current source 1030, a second current source 1040, digital input transistors M7 and M8 and a first and second switches composed of transistors M12 and M13. The sense amplifier 1000 further includes a first to third active switches respectively composed of transistors M9-M11, and a first and second write back switches respectively composed of transistors M16 and M17. The transistors M9-M11 are controlled by the active signal ACT, the transistors M16 and M17 are respectively controlled by write back signals WRITE1 and WRITE2, the first and second IO transistors M12 and M13 are controlled by the control signal CS, and the digital input transistors M7 and M8 are controlled by a read signal READ. Different from the sense amplifier 900, there are no equalize switches in sense amplifier 1000. The first and second output ends EO1 and EO2 may be equalized by shorting the transistors M12 and M13 by pulling up the control signal CS while holding the desired voltage on the first and second IO signals IOA and IOB.

Figure 10B:
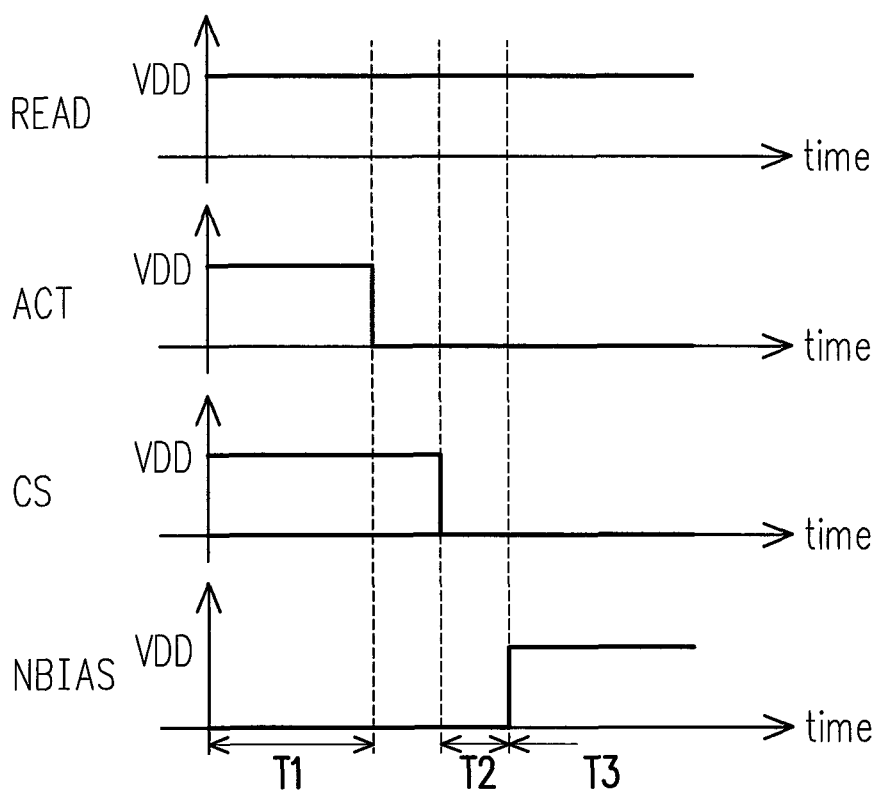
FIG. 10B and FIG. 10C are waveforms of the sense amplifier 1000.
Figure 10C:
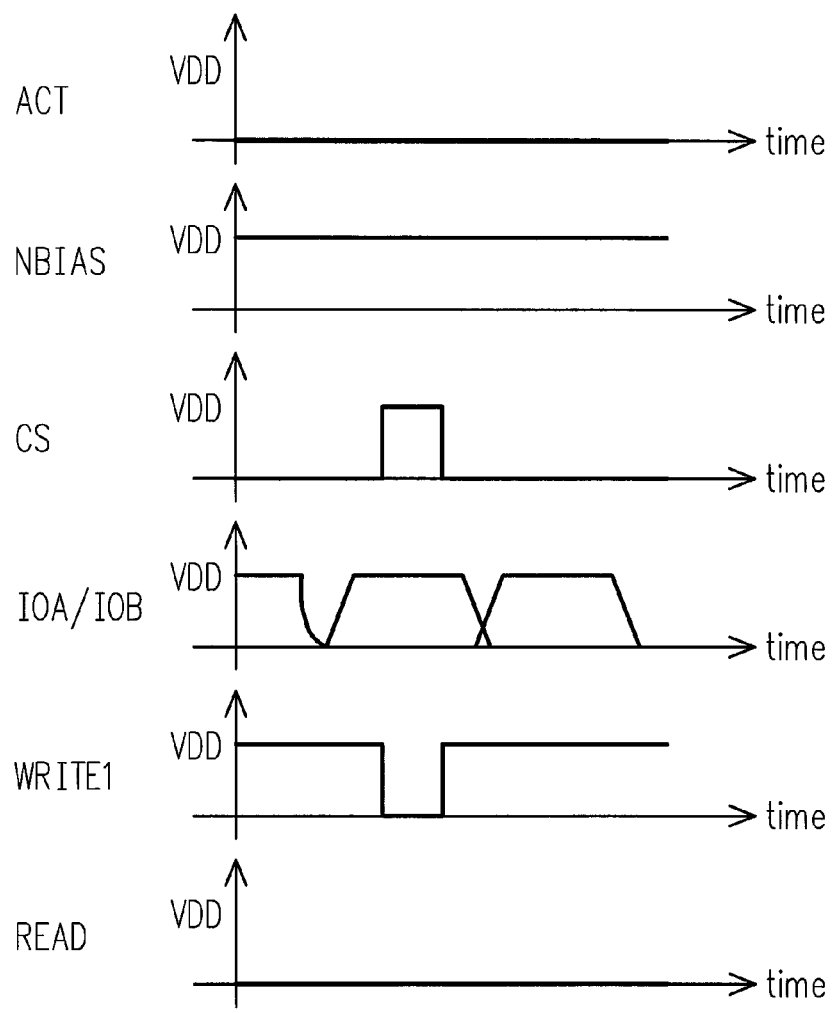

Referring to FIGS. 10B-10C, FIG. 10B and FIG. 10C are waveforms of the sense amplifier 1000. In FIG. 10B, when the sense amplifier 1000 is processing a read command, the control signal CS may be pulled high first for equalizing the first and second output ends EO1 and EO2. The waveform in FIG. 10C is same to the waveform in FIG. 9B. That is the operations for processing a write command of sense amplifier 900 and 1000 are the same.

Figure 11A:
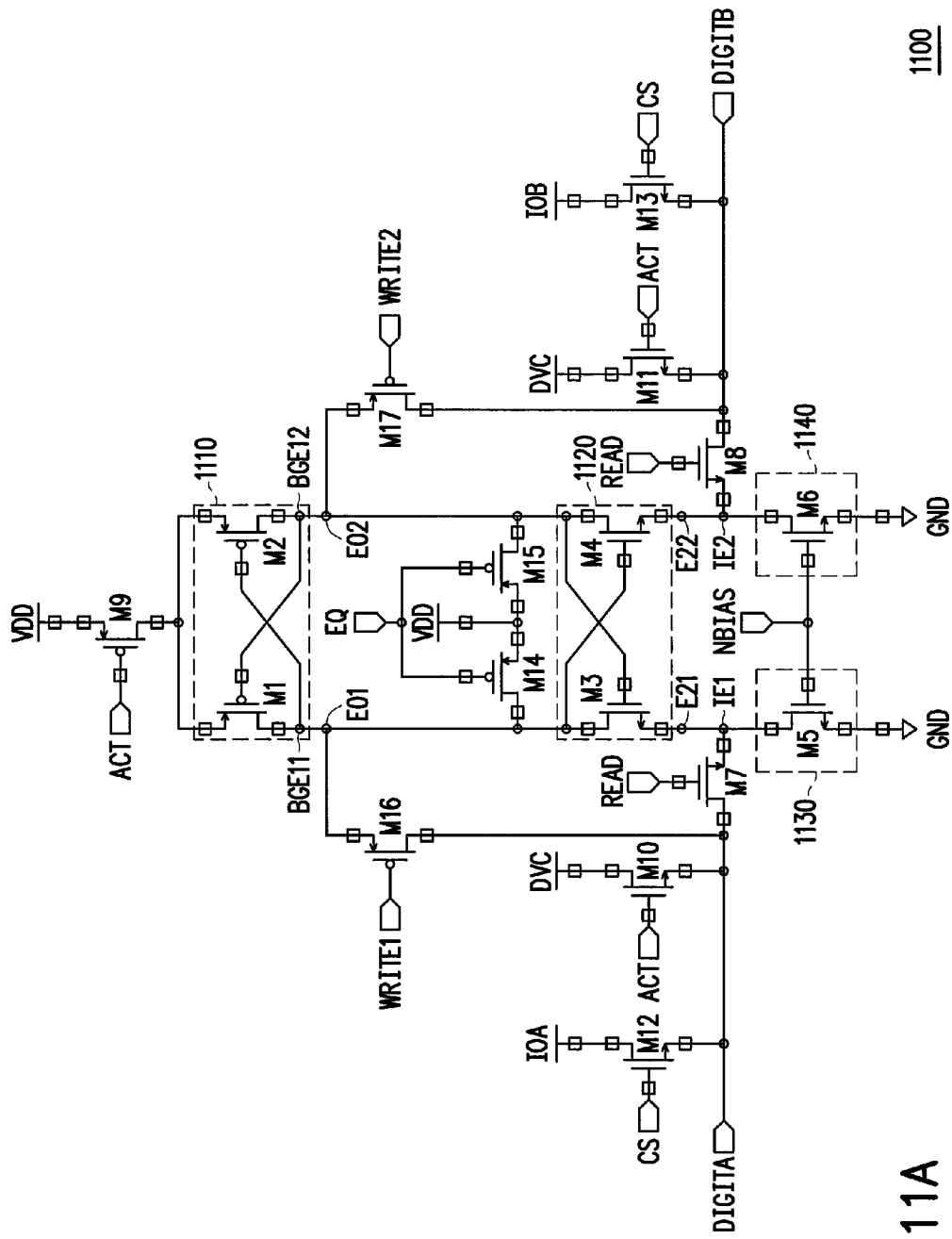
FIG. 11A is a circuit diagram of a sense amplifier 1100 according to an embodiment of the present invention.

Referring to FIG. 11A, FIG. 11A is a circuit diagram of a sense amplifier 1100 according to an embodiment of the present invention. The sense amplifier 1100 includes a first cross-coupled transistor pair 1110, a second cross-coupled transistor pair 1120, a first current source 1130, a second current source 1140, digital input transistors M7 and M8 and a first and second IO switches composed of transistors M12 and M13. The sense amplifier 1100 further includes a first to third active switches respectively composed of transistors M9-M11, and a first and second write back switches respectively composed of transistors M16 and M17. The transistors M9-M11 are controlled by the active signal ACT, the transistors M16 and M17 are respectively controlled by write back signals WRITE1 and WRITE2, the first and second IO transistors M12 and M13 are controlled by the control signal CS, and the digital input transistors M7 and M8 are controlled by a read signal READ. Different from the sense amplifier 1000, in FIG. 11A, the first and second IO switches respectively composed of transistors M12 and M13 are coupled to the first and second digital input ends. Additionally, the first and second equalize switches are respectively composed of transistors M14 and M15.

Figure 11B:
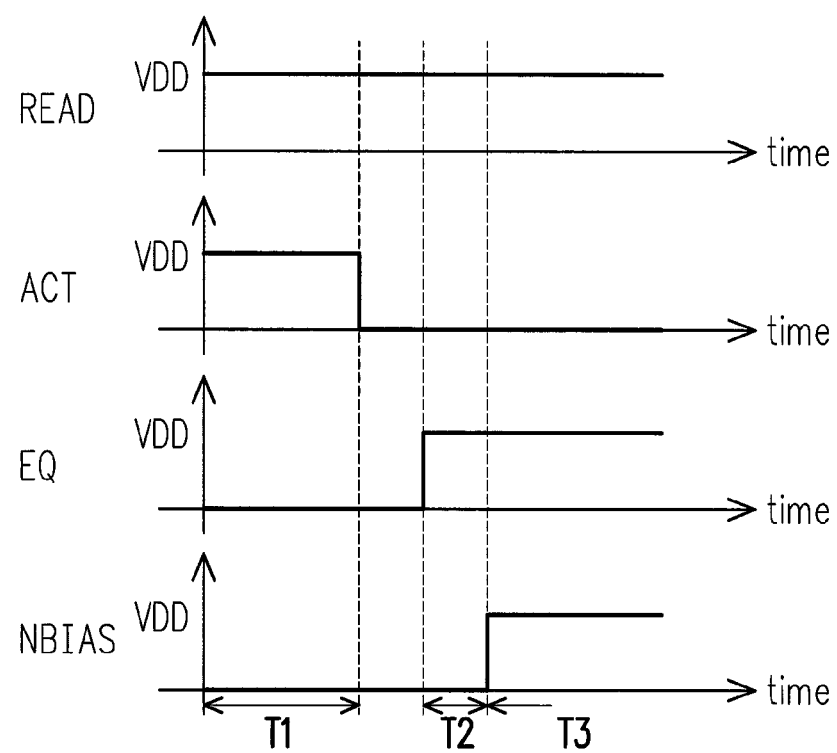
FIG. 11B and FIG. 11C are waveforms of the sense amplifier 1100.
Figure 11C:
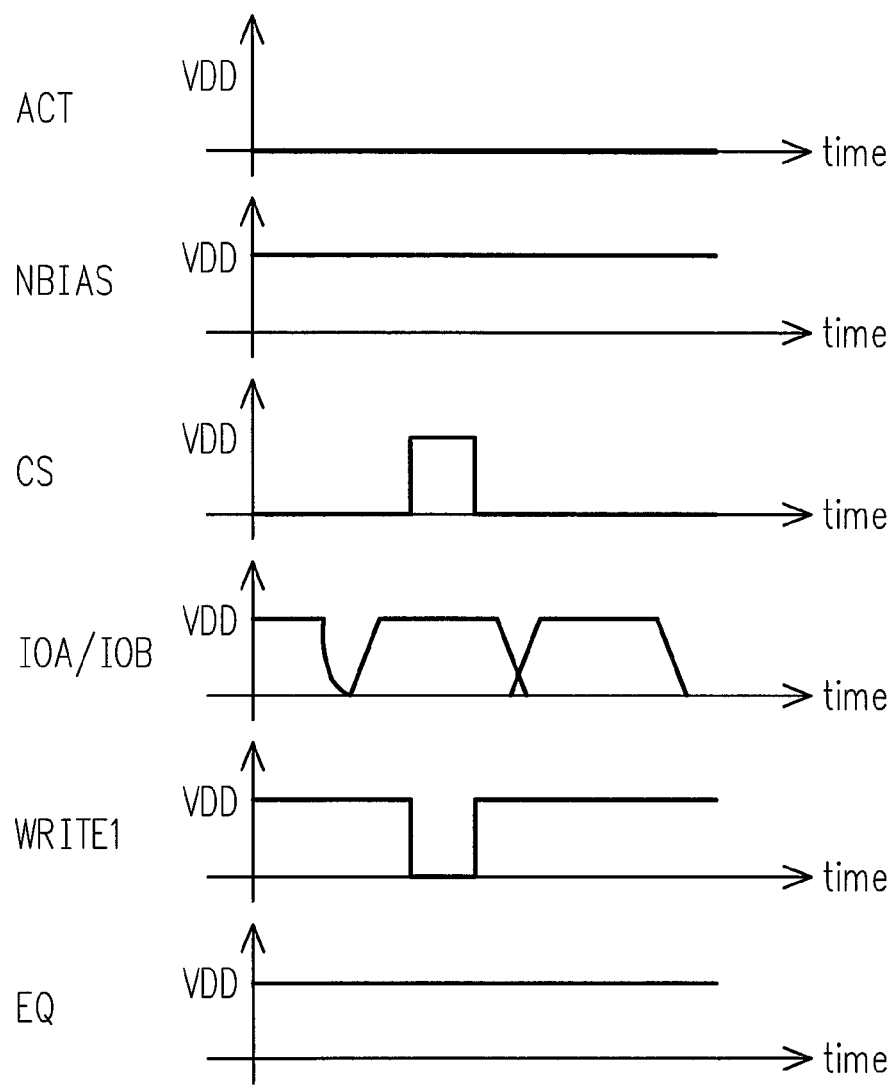

Referring to FIGS. 11B-11C, FIG. 11B and FIG. 11C are waveforms of the sense amplifier 1100. The waveforms in FIG. 11B and FIG. 11C are similar to the waveforms in FIG. 10B and FIG. 10C, except the equilibrate is not handled through the IO. That is the equilibrate takes place by coupling the operating voltage VDD to each of the first and second output ends EO1 and EO2 through each of the equalize switches M14 and M15 respectively.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A sense amplifier, comprising:
   a first cross-coupled transistor pair, having a first end, a second end, a first back gate end and a second back gate end, the first and second ends of the first cross-coupled transistor pair being coupled to an operating voltage, the first and second back gate ends of the first cross-coupled transistor pair being coupled to a first and second output ends respectively;
   a second cross-coupled transistor pair, having a first end, a second end, a first back gate end and a second back gate end, the first and second back gate ends of the second cross-coupled transistor pair being coupled to a first and second output ends respectively, and the first and second ends of the second cross-coupled transistor pair being coupled to a first digital input end and second digital input end respectively;
   a first and second current sources, the first current source being coupled between the first digital input end and a ground voltage, the second current source being coupled between the second digital input end and the ground voltage;
   a first digital input transistor, having a first end, a second end and a control end, the first end of the first digital input transistor receiving a first digital input signal, the second end of the first digital input transistor being coupled to the first digital input end, and the control end of the first digital input transistor being coupled to the second back gate end of the second cross-coupled transistor pair; and
   a second digital input transistor, having a first end, a second end and a control end, the first end of the first digital input transistor receiving a second digital input signal, the second end of the second digital input transistor being coupled to the second digital input end, and the control end of the second digital input transistor being coupled to the first back gate end of the second cross-coupled transistor pair.

2. The sense amplifier, according to claim 1, wherein the first cross-coupled transistor pair comprises:
   a first transistor, having a first end, a second end and a control end, the first end of the first transistor is coupled to the first end of the first cross-coupled transistor pair, the control end of the first transistor is coupled to second back gate end of the first cross-coupled transistor pair, the second end of the first transistor is coupled to the first back gate end of the first cross-coupled transistor pair; and
   a second transistor, having a first end, a second end and a control end, the first end of the second transistor is coupled to the second end of the first cross-coupled transistor pair, the control end of the second transistor is coupled to first back gate end of the first cross-coupled transistor pair, the second end of the second transistor is coupled to the second back gate end of the first cross-coupled transistor pair.

3. The sense amplifier, according to claim 2, wherein the first and second transistors are P-type transistors.

4. The sense amplifier, according to claim 2, wherein the second cross-coupled transistor pair comprises:
   a third transistor, having a first end, a second end and a control end, the first end of the third transistor is coupled to the first end of the second cross-coupled transistor pair, the control end of the third transistor is coupled to second back gate end of the second cross-coupled transistor pair, the second end of the third transistor is coupled to the first back gate end of the second cross-coupled transistor pair; and
   a fourth transistor, having a first end, a second end and a control end, the first end of the fourth transistor is coupled to the second end of the second cross-coupled transistor pair, the control end of the fourth transistor is coupled to first back gate end of the second cross-coupled transistor pair, the second end of the fourth transistor is coupled to the second back gate end of the second cross-coupled transistor pair.

5. The sense amplifier, according to claim 4, wherein the third and fourth transistors are N-type transistors.

6. The sense amplifier, according to claim 1, further comprising:
a first active switch, coupled on a path for the first cross-coupled transistor pair receiving the operating voltage, the first active switch being turned on or turned off according to an active signal;
a second active switch, coupled between the first end of the first digital input transistor and a reference voltage; and
a third active switch, coupled between the first end of the second digital input transistor and a reference voltage,
wherein, the second and third switches respectively pull up the first and second digital input signals to be equal to the reference voltage according to the active signal.

7. The sense amplifier, according to claim 1, further comprising:
a first and second equalize switches, the first equalize switch being coupled between the operating voltage and the first output end, the second equalize switch being coupled between the operating voltage and the second output end,
wherein, the first and second equalize switches are controlled by an equalize signal for turning on or turning off.

8. The sense amplifier, according to claim 1, further comprising:
a first and second input-output (IO) switches, a first end of the first IO switch being coupled to a first IO signal, a second end of the first IO switch being coupled to the first output end, a first end of the second IO switch being coupled to a second IO signal, a second end of the second IO switch being coupled to the second output end,
wherein, the first and second IO switches are controlled by a control signal for turning on or turning off.

9. The sense amplifier, according to claim 8, wherein the first and second IO switches are composed of transistors.

10. The sense amplifier, according to claim 1, further comprising:
a first and second write back switches, a first end of the first write back switch being coupled to the first output end, and a second end of the first write back switch being coupled to the first digital input signal, a first end of the second write back switch being coupled to the second output end, and a second end of the second write back switch being coupled to the second digital input signal,
wherein, the first and second write back switches are respectively controlled by a first and second write-back signals for turning on or turning off.

11. The sense amplifier, according to claim 10, wherein the first and second write back switches are composed of transistors.

12. The sense amplifier, according to claim 1, further comprising
a first and second write back switches, a first end of the first write back switch being coupled to the first end of the first cross-coupled transistor pair, and a second end of the first write back switch being coupled to the first digital input signal, a first end of the second write back switch being coupled to the second end of the first cross-coupled transistor pair, and a second end of the second write back switch being coupled to the second digital input signal, a control end of the first write back switch being coupled to the second back gate end of the first cross-coupled transistor pair, and a control end of the second write back switch being coupled to the first back gate end of the first cross-coupled transistor pair.

13. The sense amplifier, according to claim 1, wherein the first and second current sources are a first and second transistors respectively, the first transistor is coupled between the first digital input end and the ground voltage, the second transistor is coupled between the second digital input end and the ground voltage, the first and second transistors are controlled by a bias voltage.

14. The sense amplifier, according to claim 1, further comprising:
a equalize switch, the equalize switch being coupled between the first output end and the second output end, the equalize switch is controlled by an equalize signal for turning on or turning off.

15. The sense amplifier, according to claim 1, further comprising:
a first and second input-output (IO) switches, a first end of the first IO switch being coupled to a first IO signal, a second end of the first IO switch being coupled to the first digital input signal, a first end of the second IO switch being coupled to a second IO signal, a second end of the second IO switch being coupled to the second digital input signal,
wherein, the first and second IO switches are controlled by a control signal for turning on or turning off.

\* \* \* \* \*